US012648284B2

(12) United States Patent
Seo et al.

(10) Patent No.: US 12,648,284 B2
(45) Date of Patent: Jun. 2, 2026

(54) DISPLAY DEVICE

(71) Applicant: Samsung Display Co., LTD., Yongin-si (KR)

(72) Inventors: Ki Seong Seo, Seoul (KR); Sung Kook Park, Suwon-si (KR); Hyung Il Jeon, Seoul (KR); Byeong Hwa Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 994 days.

(21) Appl. No.: 17/661,224

(22) Filed: Apr. 28, 2022

(65) Prior Publication Data

US 2022/0352245 A1 Nov. 3, 2022

(30) Foreign Application Priority Data

Apr. 29, 2021 (KR) ........................ 10-2021-0055375

(51) Int. Cl.
| | |
|---|---|
| *H01L 27/15* | (2006.01) |
| *H10H 20/851* | (2025.01) |
| *H10H 20/855* | (2025.01) |
| *H10H 29/14* | (2025.01) |
| *H10H 20/80* | (2025.01) |

(52) U.S. Cl.
CPC ........ *H10H 29/142* (2025.01); *H10H 20/851* (2025.01); *H10H 20/855* (2025.01); *H10H 20/882* (2025.01)

(58) Field of Classification Search
CPC .. H10H 29/142; H10H 20/01; H10H 20/8312;
H10H 20/8512; H10H 20/032; H10H 20/0361; H10H 20/0364; H10H 20/831; H10H 20/857; H01L 25/167; H01L 25/0753
See application file for complete search history.

(56) References Cited

U.S. PATENT DOCUMENTS

| | | | |
|---|---|---|---|
| 10,825,951 | B2 | 11/2020 | Lee et al. |
| 11,114,499 | B2 | 9/2021 | Lee et al. |
| 11,522,008 | B2 | 12/2022 | Lee et al. |
| 12,230,666 | B2 | 2/2025 | Lee et al. |
| RE50,439 | E | 5/2025 | Lee et al. |

(Continued)

FOREIGN PATENT DOCUMENTS

| | | |
|---|---|---|
| CN | 110709995 A | 1/2020 |
| KR | 10-2017-0084139 A | 7/2017 |

(Continued)

*Primary Examiner* — Elmito Breval
(74) *Attorney, Agent, or Firm* — Womble Bond Dickinson (US) LLP

(57) ABSTRACT

There is provided a display device including a substrate, a partition wall on the substrate, a light-emitting element on the substrate in a light-emitting area partitioned by the partition wall, and extending in a thickness direction of the substrate, a light conversion layer on the light-emitting element in the light-emitting area, and configured to convert a wavelength of light emitted from the light-emitting element or to transmit the light, and an optical member including an optical pattern on the partition wall, and an optical layer on the light conversion layer, wherein a refractive index of the optical layer and a refractive index of the optical pattern are different from each other.

20 Claims, 26 Drawing Sheets

(56)         References Cited

U.S. PATENT DOCUMENTS

| | | |
|---|---|---|
| 2015/0115293 A1 | 4/2015 | Wu et al. |
| 2019/0310522 A1 | 10/2019 | Chu et al. |
| 2020/0251688 A1* | 8/2020 | Chung ................... H10K 85/40 |
| 2025/0160094 A1 | 5/2025 | Lee et al. |

FOREIGN PATENT DOCUMENTS

| | | |
|---|---|---|
| KR | 10-2018-0059249 A | 6/2018 |
| KR | 10-2019-0066359 A | 6/2019 |
| KR | 2019-0098291 A | 8/2019 |
| KR | 10-2020-0058643 A | 5/2020 |
| KR | 10-2020-0075206 A | 6/2020 |
| KR | 10-2022-0049065 A | 4/2022 |

* cited by examiner

PDA: PDA1, PDA2

PW: PW1, PW2, PW3

DISPLAY DEVICE

CROSS-REFERENCE TO RELATED APPLICATION

This application claims priority to, and the benefit of, Korean Patent Application No. 10-2021-0055375 filed on Apr. 29, 2021 in the Korean Intellectual Property Office, the disclosure of which is incorporated herein by reference in its entirety.

BACKGROUND

1. Field

The present disclosure relates to a display device.

2. Description of the Related Art

As the information society develops, the demand for display devices for displaying images is increasing in various forms. The display devices may be flat panel display devices, such as liquid-crystal display devices, field-emission display devices, light-emitting display devices, or the like. The light-emitting display device may include an organic light-emitting display device including an organic light-emitting diode (LED) element as a light-emitting element, an inorganic light-emitting display device including an inorganic semiconductor element as a light-emitting element, or a micro-LED display device including a micro-LED element as a light-emitting element.

Recently, a head-mounted display (HMD) including a light-emitting display device has been developed. The HMD is a glasses-type monitor device for virtual reality (VR) or augmented reality (AR) that is worn in the form of glasses or a helmet to form a focal point at a distance relatively close to eyes of a user.

A high-resolution micro-LED display panel including a micro-LED element is applied to the HMD. The micro-LED element emits light of a single color, and thus the micro-LED display panel may include a wavelength conversion layer, which is configured to convert a wavelength of the light emitted from the micro-LED element, to display various colors.

SUMMARY

Aspects of the present disclosure provide a display device with improved light efficiency.

It should be noted that aspects of the present disclosure are not limited to the above-described aspects, and other aspects of the present disclosure will be apparent to those skilled in the art from the following descriptions.

According to an aspect of the present disclosure, there is provided a display device including a substrate, a partition wall on the substrate, a light-emitting element on the substrate in a light-emitting area partitioned by the partition wall, and extending in a thickness direction of the substrate, a light conversion layer on the light-emitting element in the light-emitting area, and configured to convert a wavelength of light emitted from the light-emitting element or to transmit the light, and an optical member including an optical pattern on the partition wall, and an optical layer on the light conversion layer, wherein a refractive index of the optical layer and a refractive index of the optical pattern are different from each other.

The refractive index of the optical layer may be greater than the refractive index of the optical pattern.

The optical layer may be on the partition wall.

The optical layer may overlap the optical pattern.

The optical pattern may completely overlap the optical layer.

The display device may further include a color filter on the optical member.

The display device may further include a capping layer between the light conversion layer and the optical layer, and including an inorganic material.

The capping layer may be between the light conversion layer and the optical layer, and between the partition wall and the optical pattern.

The optical pattern may have a line shape extending in one direction.

The display device may further include a light scattering layer between the light conversion layer and the light-emitting element in the light-emitting area, and including scattering particles.

The light scattering layer and the light conversion layer may be in direct contact with each other.

According to another aspect of the present disclosure, there is provided a display device including a substrate, a first light-emitting area configured to emit first light, a second light-emitting area configured to emit second light, and a third light-emitting area configured to emit third light, the light-emitting areas being in a display area of the substrate, a partition wall configured to partition the first light-emitting area, the second light-emitting area, and the third light-emitting area, a light-emitting element in each of the first light-emitting area, the second light-emitting area, and the third light-emitting area to be spaced apart from the partition wall, and extending in a thickness direction of the substrate, a light conversion layer on one of the light-emitting elements, and configured to convert a wavelength of light emitted from the one of the light-emitting elements or to transmit the light, and an optical member including an optical pattern on the partition wall, and an optical layer on the light conversion layer, wherein a refractive index of the optical layer is greater than a refractive index of the optical pattern.

The light conversion layer includes a light transmission layer in the first light-emitting area, and configured to transmit the light, a first wavelength conversion layer in the second light-emitting area, and configured to convert a portion of the first light into the second light, and a second wavelength conversion layer in the third light-emitting area, and configured to convert a portion of the first light into the third light.

The display device may further include a light scattering layer between the light conversion layer and the light-emitting element in a respective one of the light-emitting areas, and including scattering particles.

The light scattering layer and the light conversion layer are in direct contact with each other.

According to still another aspect of the present disclosure, there is provided a display device including a substrate, a pixel electrode on the substrate in a light-emitting area, light-emitting elements on the pixel electrode, and extending in a thickness direction of the substrate, and an optical member on the pixel electrode, and including an optical pattern configured to expose an upper surface of the pixel electrode, and an optical layer on the optical pattern, a refractive index of the optical layer being greater than a refractive index of the optical pattern.

The optical pattern may partially overlap the pixel electrode.

The optical layer may overlap the optical pattern.

The optical layer may expose an upper surface of the light-emitting elements and an upper end portion of a side surface of the light-emitting elements.

The display device may further include a common electrode on the optical layer and the light-emitting elements, and in direct contact with the upper surface of the light-emitting elements and the upper end portion of the side surface of the light-emitting elements.

Details of other embodiments are incorporated in the detailed description and the drawings.

BRIEF DESCRIPTION OF THE DRAWINGS

The above and other aspects and features of the present disclosure will become more apparent by describing embodiments thereof in detail with reference to the attached drawings, in which.

DETAILED DESCRIPTION

Figure 1:
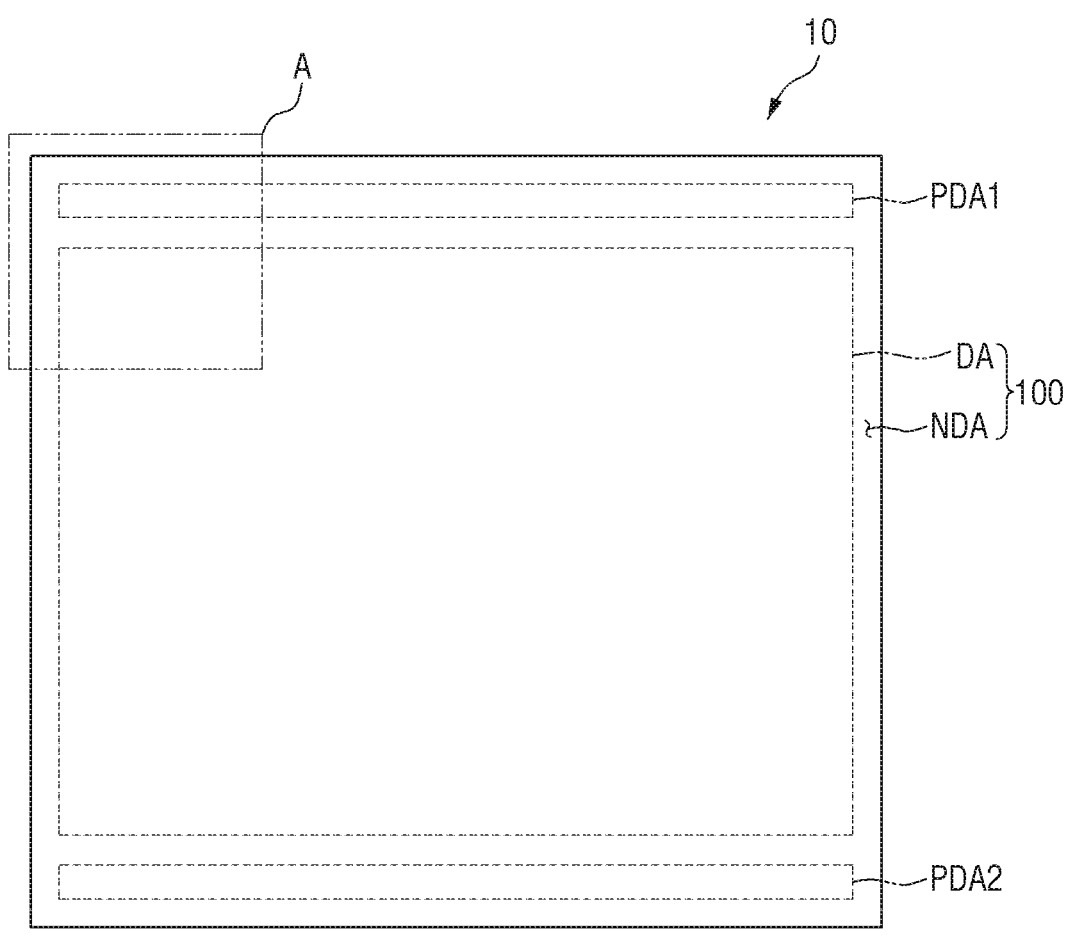
FIG. 1 is a layout diagram illustrating a display device according to some embodiments.
Figure 1:
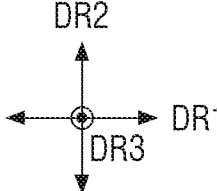

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
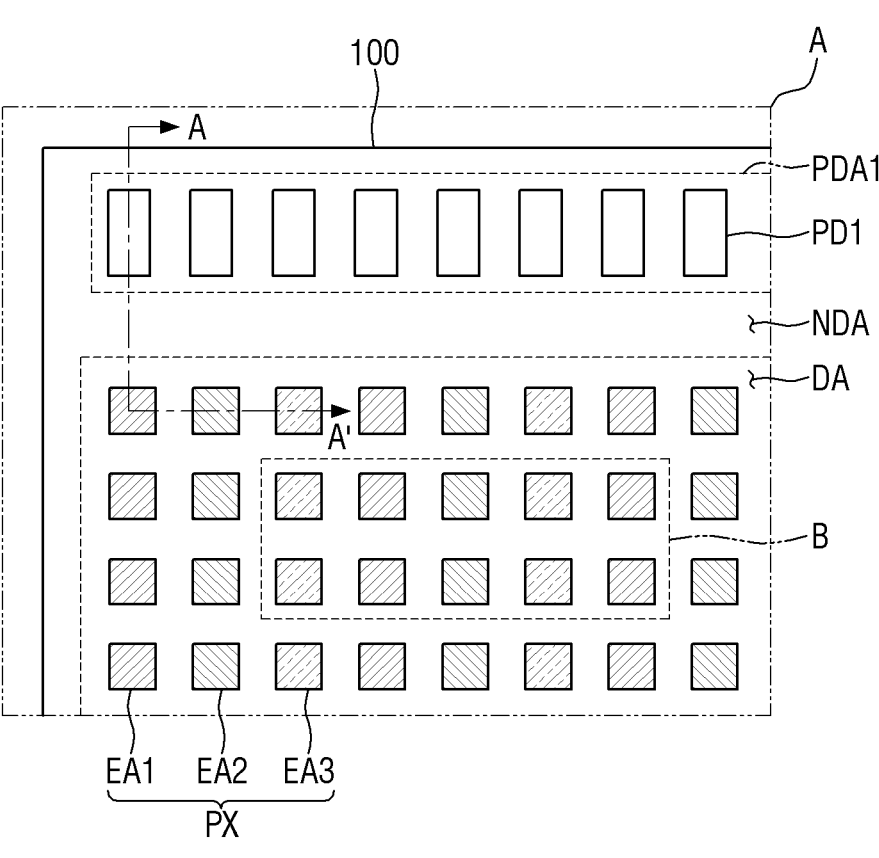
FIG. 2 is a layout diagram illustrating area A of FIG. 1 in detail.
Figure 2:
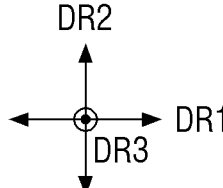
Figure 3:
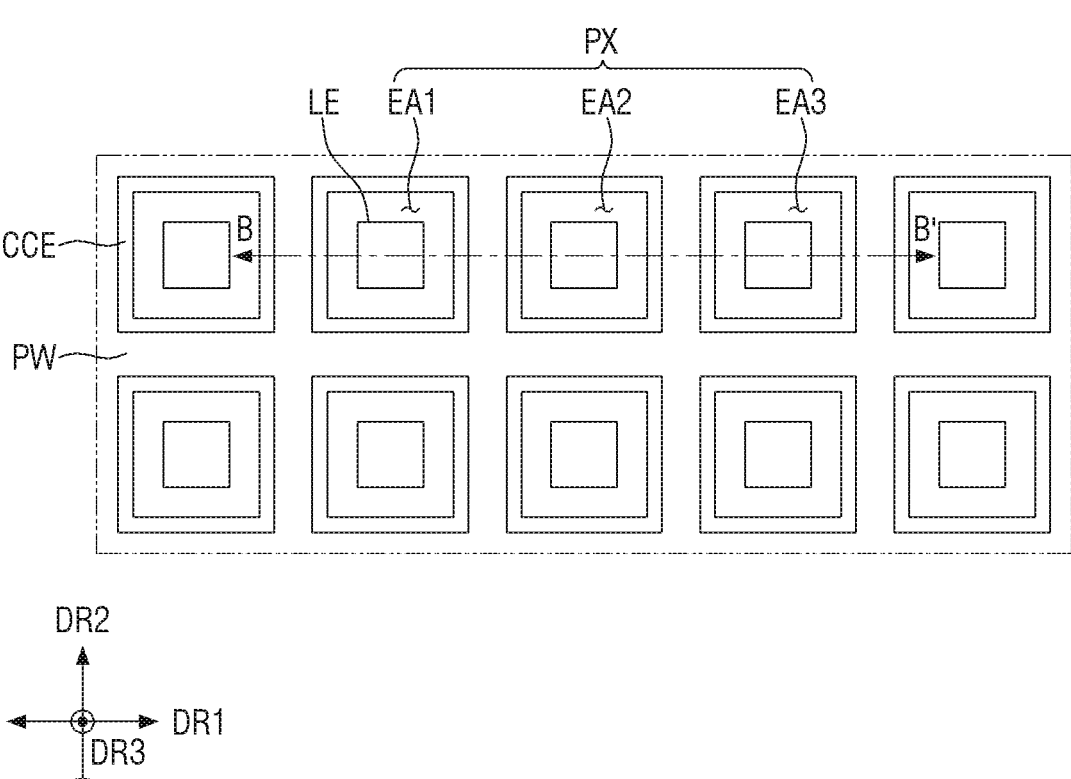
FIG. 3 is a layout diagram of pixels of a display panel according to some embodiments.

FIG. 1 is a layout diagram illustrating a display device according to some embodiments. FIG. 2 is a layout diagram illustrating area A of FIG. 1 in detail. FIG. 3 is a layout diagram of pixels of a display panel according to some embodiments.

In FIGS. 1 to 3, it will be mainly described that the display device according to some embodiments is a micro light-emitting diode (LED) display including a micro-LED as a light-emitting element, but the present specification is not limited thereto.

Further, in FIGS. 1 to 3, it will be mainly described that the display device according to some embodiments is a light-emitting diode-on-silicon (LEDoS) in which LED elements are located on a semiconductor circuit substrate 110 formed by a semiconductor process, but it should be noted that the present specification is not limited thereto.

Further, in FIGS. 1 to 3, a first direction DR1 indicates a transverse direction of a display panel 100, a second direction DR2 indicates a longitudinal direction of the display panel 100, and a third direction DR3 indicates a thickness direction of the display panel 100 or a thickness direction of the semiconductor circuit substrate 110. In this case, "left," "right," "upper," and "lower" represent directions when the display panel 100 is viewed in a plan view. For example, "rightward" may represent one side of the first direction DR1, "leftward" may represent the other side of the first direction DR1, "upward" may represent one side of the second direction DR2, and "downward" may represent the other side of the second direction DR2. In addition, an "upper portion" indicates one side of the third direction DR3, and a "lower portion" may indicate the other side of the third direction DR3.

Referring to FIGS. 1 to 3, a display device 10 according to some embodiments includes the display panel 100 having a display area DA and a non-display area NDA.

In a plan view, the display panel 100 may have a quadrangular shape having long sides extending in the first direction DR1 and short sides extending in the second direction DR2. However, the shape of the display panel 100 in a plan view is not limited thereto, and may have another polygonal shape other than the quadrangular shape, a circular shape, an elliptical shape, or irregular planar shapes.

The display area DA may be an area in which an image is displayed, and the non-display area NDA may be an area in which an image is not displayed. A shape of the display area DA in a plan view may follow the shape of the display panel 100 in a plan view. In FIG. 1, the shape of the display area DA in a plan view is illustrated as a quadrangular shape. The display area DA may be located in a central area of the display panel 100. The non-display area NDA may be located around the display area DA. The non-display area NDA may surround the display area DA.

The display area DA of the display panel 100 may include a plurality of pixels PX. Each of the pixels PX may be defined as a minimum light-emitting unit that is able to display white light.

Each of the plurality of pixels PX may include a plurality of light-emitting areas EA1, EA2, and EA3 that emit light. In some embodiments of the present specification, each of the plurality of pixels PX includes three light-emitting areas EA1, EA2, and EA3, but the present disclosure is not limited thereto. For example, each of the plurality of pixels PX may include four light-emitting areas.

Each of the plurality of light-emitting areas EA1, EA2, and EA3 may include a light-emitting element LE that emits first light. The light-emitting element LE is illustrated as having a quadrangular shape in a plan view, but the present specification is not limited thereto. For example, the light-emitting element LE may have a polygonal shape other than the quadrangular shape, a circular shape, an elliptical shape, or an irregular shape.

Each first light-emitting area EA1 indicates an area that emits the first light. Each of the first light-emitting areas EA1 may output the first light output from the light-emitting element LE as it is. The first light may be light of a blue wavelength band. The blue wavelength band may be in a range of about 370 nm to about 460 nm, but the present specification is not limited thereto.

Each second light-emitting area EA2 indicates an area that emits second light. Each of the second light-emitting areas EA2 may convert a portion of the first light output from the light-emitting element LE into the second light, and may output the second light. The second light may be light of a green wavelength band. The green wavelength band may be in a range of about 480 nm to about 560 nm, but the present specification is not limited thereto.

Each third light-emitting area EA3 indicates an area that emits third light. Each of the third light-emitting areas EA3 may convert a portion of the first light output from the light-emitting element LE into the third light, and may output the third light. The third light may be light of a red wavelength band. The red wavelength band may be in a range of about 600 nm to about 750 nm, but the present specification is not limited thereto.

The first light-emitting areas EA1, the second light-emitting areas EA2, and the third light-emitting areas EA3 may be alternately arranged in the first direction DR1. For example, the first light-emitting areas EA1, the second light-emitting areas EA2, and the third light-emitting areas EA3 may be arranged in the order of the first light-emitting area EA1, the second light-emitting area EA2, and the third light-emitting area EA3 in the first direction DR1.

A plurality of the first light-emitting areas EA1 may be arranged in the second direction DR2. A plurality of the second light-emitting areas EA2 may be arranged in the second direction DR2. A plurality of the third light-emitting areas EA3 may be arranged in the second direction DR2.

The light-emitting areas EA1, EA2, and EA3 may be partitioned by a partition wall PW. The partition wall PW may surround the light-emitting element LE. The partition wall PW may be spaced apart from the light-emitting element LE. The partition wall PW may have a mesh shape, a network shape, or a grid shape in a plan view.

In FIGS. 2 and 3, each of the plurality of light-emitting areas EA1, EA2, and EA3 defined by the partition wall PW is illustrated as having a quadrangular shape in a plan view, but the present specification is not limited thereto. For example, each of the plurality of light-emitting areas EA1, EA2, and EA3 defined by the partition wall PW may have a polygonal shape other than the quadrangular shape, a circular shape, an elliptical shape, or an irregular shape.

A common connection electrode CCE may overlap the partition wall PW in the third direction DR3. The common connection electrode CCE may surround the light-emitting element LE. The common connection electrode CCE may be spaced apart from the light-emitting element LE. The common connection electrode CCE may have a mesh shape, a network shape, or a grid shape in a plan view.

A width Wcce (see FIG. 7) of the common connection electrode CCE in the first direction DR1 or the second direction DR2 may be greater than a width Wpw (see FIG. 7) of the partition wall PW in the first direction DR1 or the second direction DR2. The partition wall PW may completely overlap the common connection electrode CCE in the third direction DR3. A portion of the common connection electrode CCE may overlap the partition wall PW in the third direction DR3.

The non-display area NDA may include a first pad portion PDA1 and a second pad portion PDA2.

The first pad portion PDA1 may be located in the non-display area NDA. The first pad portion PDA1 may be located on an upper side of the display panel 100. The first pad portion PDA1 may include first pads PD1 connected to an external circuit board CB (see FIG. 4).

The second pad portion PDA2 may be located in the non-display area NDA. The second pad portion PDA2 may be located on a lower side of the semiconductor circuit substrate 110. The second pad portion PDA2 may include second pads connected to the external circuit board CB (see FIG. 4). The second pad portion PDA2 may be omitted.

Figure 4:
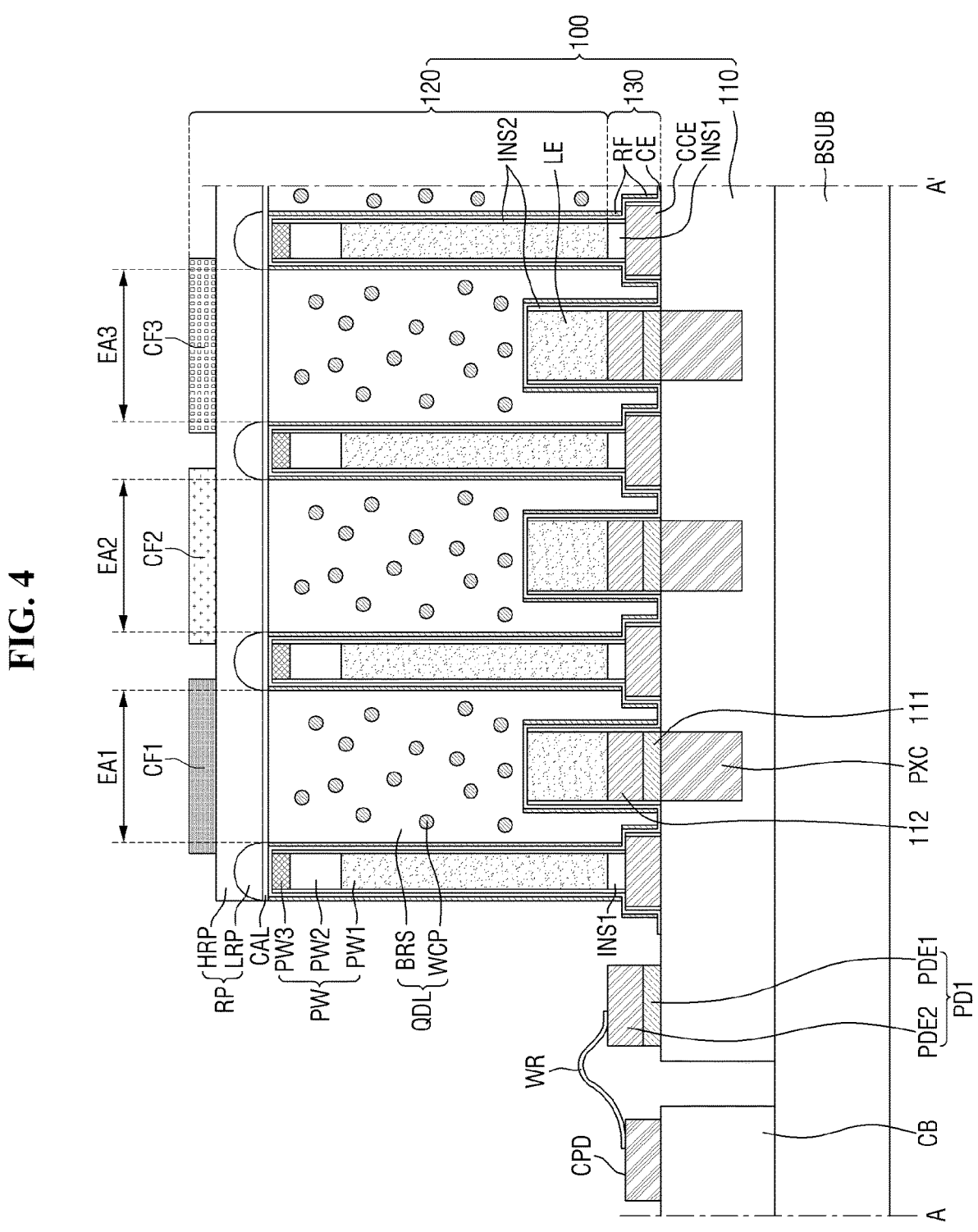
FIG. 4 is a cross-sectional view illustrating an example of the display panel taken along the line A-A' of FIG. 2.
Figure 5:
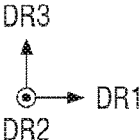
FIG. 5 is a cross-sectional view illustrating an example of the display panel taken along the line B-B' of FIG. 3.
Figure 6:
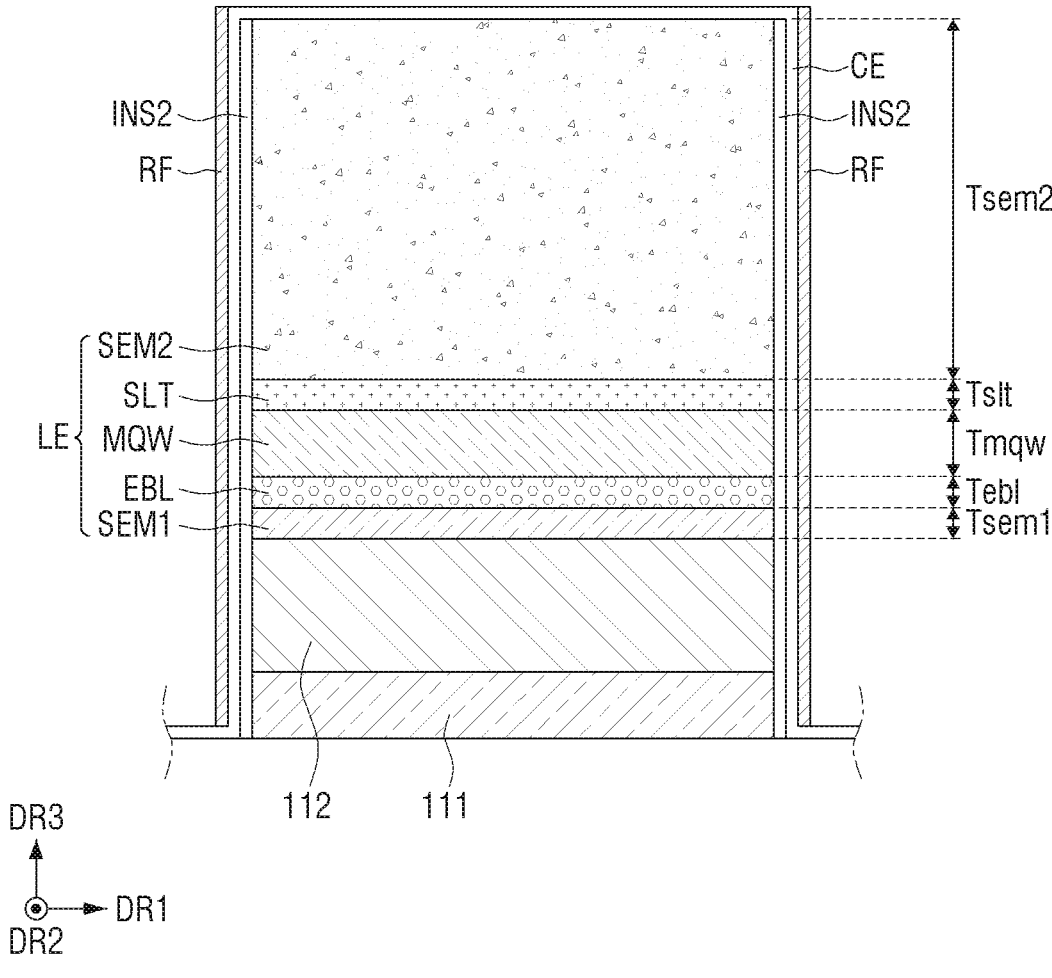
FIG. 6 is an enlarged cross-sectional view illustrating an example of a light-emitting element of FIG. 5 in detail.
Figure 7:
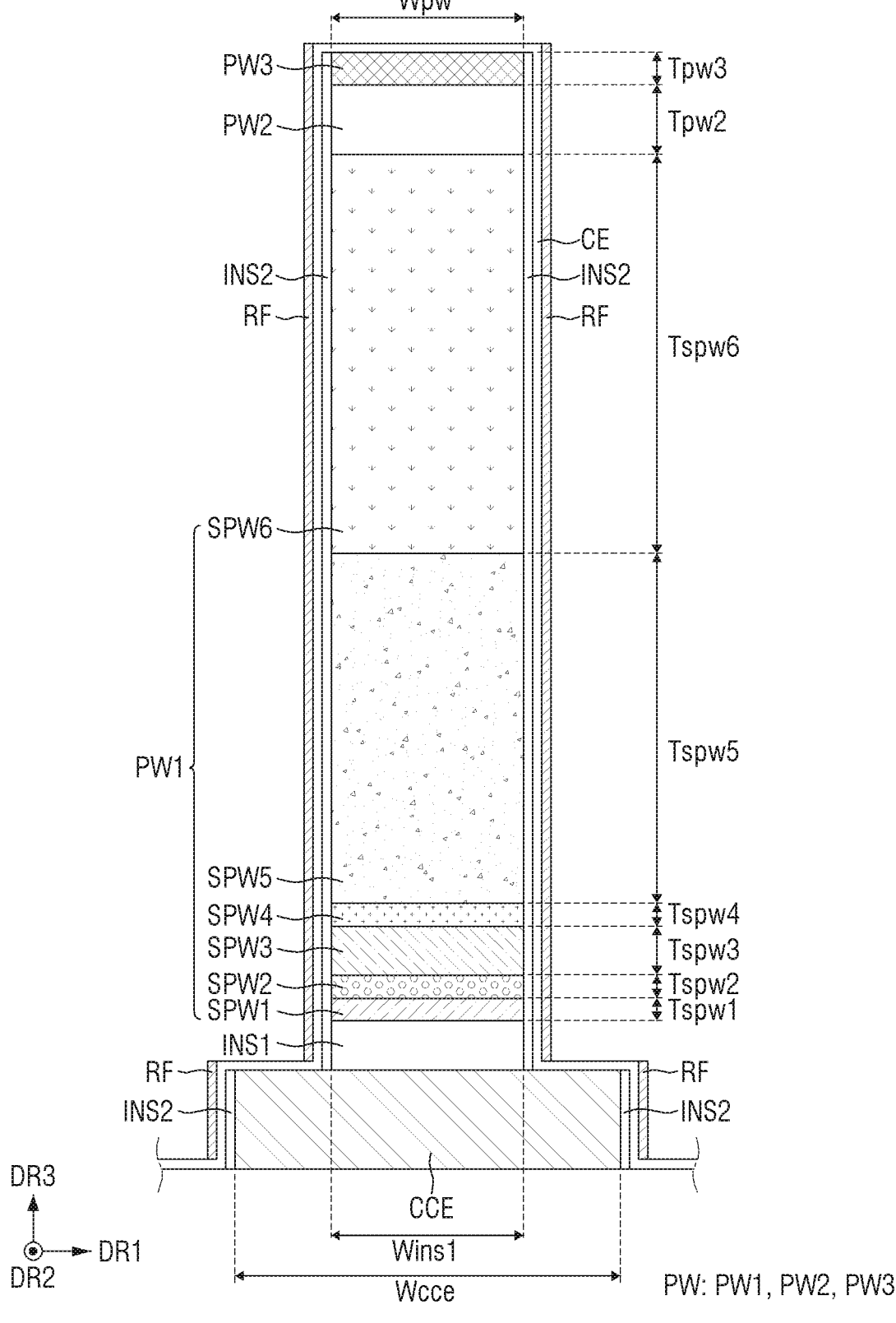
FIG. 7 is an enlarged cross-sectional view illustrating an example of a partition wall of FIG. 5 in detail.

FIG. 4 is a cross-sectional view illustrating an example of the display panel taken along the line A-A' of FIG. 2. FIG. 5 is a cross-sectional view illustrating an example of the display panel taken along the line B-B' of FIG. 3. FIG. 6 is an enlarged cross-sectional view illustrating an example of the light-emitting element of FIG. 5 in detail. FIG. 7 is an enlarged cross-sectional view illustrating an example of the partition wall of FIG. 5 in detail.

Referring to FIGS. 4 to 7, the display panel 100 may include the semiconductor circuit substrate 110, a conductive connection layer 130, and a light-emitting element layer 120.

The semiconductor circuit substrate 110 may include a plurality of pixel circuit portions PXC and a plurality of pixel electrodes 111 (e.g., thereon). The conductive connection layer 130 may include connection electrodes 112, the first pads PD1, the common connection electrode CCE, a first insulating film INS1, and a conductive pattern.

The semiconductor circuit substrate 110 may be a silicon wafer substrate formed by a semiconductor process. The plurality of pixel circuit portions PXC of the semiconductor circuit substrate 110 may be formed by a semiconductor process.

The plurality of pixel circuit portions PXC may be located in the display area DA. Each of the plurality of pixel circuit portions PXC may be connected to the pixel electrode 111 corresponding thereto. That is, the plurality of pixel circuit portions PXC may be connected to the plurality of pixel electrodes 111, respectively, in a corresponding manner. Each of the plurality of pixel circuit portions PXC may overlap the light-emitting element LE in the third direction DR3.

Each of the plurality of pixel circuit portions PXC may include at least one transistor formed by a semiconductor process. In addition, each of the plurality of pixel circuit portions PXC may further include at least one capacitor formed by a semiconductor process. Each of the pixel circuit portions PXC may apply a pixel voltage or an anode voltage to the pixel electrode 111.

Each of the pixel electrodes 111 may be located on the pixel circuit portion PXC corresponding thereto. Each of the pixel electrodes 111 may be an exposed electrode that is exposed from the pixel circuit portion PXC. That is, each of the pixel electrodes 111 may protrude from an upper surface of the pixel circuit portion PXC. Each of the pixel electrodes 111 may be integrally formed with a respective one of the pixel circuit portions PXC. Each of the pixel electrodes 111 may receive the pixel voltage or the anode voltage from the pixel circuit portion PXC. The pixel electrodes 111 may be formed of aluminum (Al).

Each of the connection electrodes 112 may be located on the pixel electrode 111 corresponding thereto. Each of the connection electrodes 112 may be located on a respective pixel electrode 111. The connection electrodes 112 may include a metal material for bonding the pixel electrodes 111 and the light-emitting elements LE. For example, the connection electrodes 112 may each include at least one of gold (Au), copper (Cu), aluminum (Al), and tin (Sn). Alternatively, each of the connection electrodes 112 may include a first layer including any one of gold (Au), copper (Cu), aluminum (Al), and tin (Sn), and a second layer including another one of gold (Au), copper (Cu), aluminum (Al), and tin (Sn). In this case, the second layer may be located on the first layer.

The common connection electrode CCE may be spaced apart from the pixel electrode 111 and the connection electrode 112. The common connection electrode CCE may surround (e.g., partially and/or in a plan view) the pixel electrode 111 and the connection electrode 112.

The common connection electrode CCE may be connected to any one of the first pads PD1 of the first pad portion PDA1 of the non-display area NDA or to any one of the second pads of the second pad portion PDA2 to receive a common voltage. The common connection electrode CCE may include the same material as the connection electrodes 112. For example, the common connection electrode CCE may include at least one of gold (Au), copper (Cu), aluminum (Al), and tin (Sn). When each of the connection electrodes 112 includes the first layer and the second layer, the common connection electrode CCE may include the same material as the first layer of each of the connection electrodes 112.

The first insulating film INS1 may be located on the common connection electrode CCE. The first insulating film INS1 may be formed of an inorganic film such as a silicon oxide ($SiO_2$) film, an aluminum oxide ($Al_2O_3$) film, or a hafnium oxide ($HfO_x$) film. A width Wins1 (see FIG. 7) of the first insulating film INS1 in the first direction DR1 or in the second direction DR2 may be less than the width Wcce (see FIG. 7) of the common connection electrode CCE in the first direction DR1 or the second direction DR2. Accordingly, a portion of an upper surface of the common connection electrode CCE may be exposed without being covered by the first insulating film INS1. The portion of the upper surface of the common connection electrode CCE exposed without being covered by the first insulating film INS1 may be in contact with a common electrode CE. Thus, the common electrode CE may be connected to the common connection electrode CCE.

The conductive pattern may be located on the first insulating film INS1. The conductive pattern may be located between the first insulating film INS1 and the partition wall PW. A width of the conductive pattern may be substantially the same as the width Wins1 of the first insulating film INS1 or the width Wpw of the partition wall PW.

The conductive pattern corresponds to a residual material formed by the same process as the connection electrodes 112 and the common connection electrode CCE. Thus, the conductive pattern may include the same material as the connection electrodes 112 and the common connection electrode CCE. For example, the conductive pattern may include at least one of gold (Au), copper (Cu), aluminum (Al), and tin (Sn). When each of the connection electrodes 112 includes the first layer and the second layer, the conductive pattern may include the same material as the second layer of each of the connection electrodes 112.

Each of the first pads PD1 may be connected to a corresponding pad CPD of the circuit board CB through a corresponding conductive connection member, such as a corresponding wire WR. That is, the pads CPD of the circuit board CB, the wires WR, and the first pads PD1 may be connected to each other in a one-to-one manner.

Each of the first pads PD1 may include a first pad electrode PDE1 and a second pad electrode PDE2. The first pad electrode PDE1 may include the same material as the pixel electrode 111. The second pad electrode PDE2 may include the same material as the connection electrodes 112. For example, the second pad electrode PDE2 may include at least one of gold (Au), copper (Cu), aluminum (Al), and tin (Sn). When each of the connection electrodes 112 includes the first layer and the second layer, the second pad electrode PDE2 may also include a first layer and a second layer.

The semiconductor circuit substrate 110 and the circuit board CB may be located on a base substrate BSUB. The semiconductor circuit substrate 110 and the circuit board CB may be attached to an upper surface of the base substrate BSUB using an adhesive member, such as a pressure-sensitive adhesive.

The circuit board CB may be a flexible printed circuit board (FPCB), a printed circuit board (PCB), a flexible printed circuit (FPC), or a flexible film such as a chip-on-film (COF).

Meanwhile, the second pads of the second pad portion PDA2 may be substantially the same as the first pads PD1 described with reference to FIGS. 4 and 5, and thus a description thereof will be omitted.

The light-emitting element layer 120 may include light-emitting elements LE, the partition wall PW, a second insulating film INS2, the common electrode CE, a reflective film RF, a wavelength conversion layer QDL, an optical member RP, and a plurality of color filters CF1, CF2, and CF3.

The light-emitting element layer 120 may include the first light-emitting areas EA1, the second light-emitting areas EA2, and the third light-emitting areas EA3 that are partitioned by the partition wall PW. In each of the first light-emitting areas EA1, the second light-emitting areas EA2, and the third light-emitting areas EA3, the light-emitting element LE, the wavelength conversion layer QDL, and a corresponding one of the plurality of color filters CF1, CF2, and CF3 may be located.

In each of the first light-emitting areas EA1, the second light-emitting areas EA2, and the third light-emitting areas EA3, the light-emitting element LE may be located on the connection electrode 112. The light-emitting element LE may be a vertical LED element extending in the third direction DR3. That is, a length of the light-emitting element LE in the third direction DR3 may be greater than a length thereof in a horizontal direction. The length in the horizontal direction indicates a length in the first direction DR1 or in the second direction DR2. For example, the length of the light-emitting element LE in the third direction DR3 may be in a range of about 1 μm to about 5 μm.

The light-emitting element LE may be a micro-LED element. As shown in FIG. 6, the light-emitting element LE includes a first semiconductor layer SEM1, an electron blocking layer EBL, an active layer MQW, a superlattice layer SLT, and a second semiconductor layer SEM2 in the third direction DR3. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be located on the connection electrode 112. The first semiconductor layer SEM1 may be doped with a first conductive type dopant such as Mg, Zn, Ca, Se, Ba, or the like. For example, the first semiconductor layer SEM1 may be p-GaN doped with Mg which is a p-type dopant. The first semiconductor layer SEM1 may have a thickness of about 30 nm to about 200 nm.

The electron blocking layer EBL may be located on the first semiconductor layer SEM1. The electron blocking layer EBL may be a layer for suppressing or preventing too many electrons from flowing into the active layer MQW. For example, the electron blocking layer EBL may be p-AlGaN doped with Mg which is a p-type dopant. The electron blocking layer EBL may have a thickness of about 10 nm to about 50 nm. The electron blocking layer EBL may be omitted.

The active layer MQW may be located on the electron blocking layer EBL. The active layer MQW may emit light due to a combination of electron-hole pairs in response to electrical signals applied through the first semiconductor layer SEM1 and the second semiconductor layer SEM2. The active layer MQW may emit first light having a center wavelength band ranging from about 450 nm to about 495 nm (e.g., light of a blue wavelength band).

The active layer MQW may include a material having a single or multiple quantum well structure. When the active layer MQW includes a material having a multiple quantum well structure, the active layer MQW may have a structure in which a plurality of well layers and a plurality of barrier layers may be alternately stacked. In this case, the well layer is formed of InGaN, and the barrier layer may be formed of GaN or AlGaN, but the present disclosure is not limited thereto. The well layer may have a thickness of about 1 nm to about 4 nm, and the barrier layer may have a thickness of about 3 nm to about 10 nm.

Alternatively, the active layer MQW may have a structure in which semiconductor materials having large bandgap energy and semiconductor materials having small bandgap energy are alternately stacked or include other group III or group V semiconductor materials according to a wavelength band of emitted light. The light emitted by the active layer MQW is not necessarily limited to the first light (light of a blue wavelength band), and in some embodiments, the active layer MQW may emit second light (light of a green wavelength band) or third light (light of a red wavelength band).

The superlattice layer SLT may be located on the active layer MQW. The superlattice layer SLT may be a layer for reducing stress between the second semiconductor layer SEM2 and the active layer MQW. For example, the superlattice layer SLT may be formed of InGaN or GaN. The superlattice layer SLT may have a thickness of about 50 nm to about 200 nm. The superlattice layer SLT may be omitted.

The second semiconductor layer SEM2 may be located on the superlattice layer SLT. The second semiconductor layer SEM2 may be doped with a second conductive dopant such as Si, Ge, Sn, or the like. For example, the second semiconductor layer SEM2 may be n-GaN doped with Si, which is an n-type dopant. The second semiconductor layer SEM2 may have a thickness of about 2 $\mu$m to about 4 $\mu$m.

The partition wall PW may be spaced apart from the light-emitting element LE located in each of the first light-emitting areas EA1, the second light-emitting areas EA2, and the third light-emitting areas EA3. The partition wall PW may surround the light-emitting element LE located in each of the first light-emitting areas EA1, the second light-emitting areas EA2, and the third light-emitting areas EA3.

The partition wall PW may be located on the common connection electrode CCE. The width Wpw of the partition wall PW in the first direction DR1 and the second direction DR2 may be less than the width Wcce of the common connection electrode CCE in the first direction DR1 and the second direction DR2. The partition wall PW may be spaced apart from the light-emitting elements LE.

The partition wall PW may include a first partition wall PW1, a second partition wall PW2, and a third partition wall PW3.

The first partition wall PW1 may be located on the first insulating film INS1. The first partition wall PW1 is formed by the same process as the light-emitting element LE, and thus at least a partial area of the first partition wall PW1 may include the same material as the light-emitting element LE.

The first partition wall PW1 may include a plurality of sub-partitions SPW1 to SPW6 sequentially stacked in the third direction DR3. For example, the first partition wall PW1 may include a first sub-partition wall SPW1, a second sub-partition wall SPW2, a third sub-partition wall SPW3, a fourth sub-partition wall SPW4, a fifth sub-partition wall SPW5, and a sixth sub-partition wall SPW6.

The first sub-partition wall SPW1 may be formed of the same material as the first semiconductor layer SEM1 of the light-emitting element LE. The first sub-partition wall SPW1 may be formed in the same process as the first semiconductor layer SEM1 of the light-emitting element LE. A thickness Tspw1 of the first sub-partition wall SPW1 may be substantially the same as a thickness Tsem1 of the first semiconductor layer SEM1 of the light-emitting element LE.

The second sub-partition wall SPW2 may be formed of the same material as the electron blocking layer EBL of the light-emitting element LE. The second sub-partition wall SPW2 may be formed in the same process as the electron blocking layer EBL of the light-emitting element LE. A thickness Tspw2 of the second sub-partition wall SPW2 may be substantially the same as a thickness Tebl of the electron blocking layer EBL of the light-emitting element LE. When the electron blocking layer EBL is omitted, the second sub-partition wall SPW2 may also be omitted.

The third sub-partition wall SPW3 may be formed of the same material as the active layer MQW of the light-emitting element LE. The third sub-partition wall SPW3 may be formed in the same process as the active layer MQW of the light-emitting element LE. A thickness Tspw3 of the third sub-partition wall SPW3 may be substantially the same as a thickness Tmqw of the active layer MQW of the light-emitting element LE.

The fourth sub-partition wall SPW4 may be formed of the same material as the superlattice layer SLT of the light-emitting element LE. The fourth sub-partition wall SPW4 may be formed in the same process as the superlattice layer SLT of the light-emitting element LE. A thickness Tspw4 of the fourth sub-partition wall SPW4 may be substantially the same as a thickness Tslt of the superlattice layer SLT of the light-emitting element LE.

The fifth sub-partition wall SPW5 may be formed of the same material as the second semiconductor layer SEM2 of the light-emitting element LE. The fifth sub-partition wall SPW5 may be formed in the same process as the second semiconductor layer SEM2 of the light-emitting element LE. In a process of manufacturing the display panel 100, the fifth sub-partition wall SPW5 is not removed, but a portion of the second semiconductor layer SEM2 of the light-emitting element LE is removed, and thus a thickness Tspw5 of the fifth sub-partition wall SPW5 may be greater than a thickness Tsem2 of the second semiconductor layer SEM2 of the light-emitting element LE.

The sixth sub-partition wall SPW6 may be formed of a semiconductor layer, into which a dopant is not doped, that is, an undoped semiconductor layer. For example, the sixth sub-partition wall SPW6 may be undoped GaN. A thickness Tspw6 of the sixth sub-partition wall SPW6 may be greater than the thickness Tsem2 of the second semiconductor layer SEM2 of the light-emitting element LE. The thickness Tspw6 of the sixth sub-partition wall SPW6 may be in a range of about 2 $\mu$m to about 3 $\mu$m.

The second partition wall PW2 and the third partition wall PW3 may serve as masks for reducing or preventing a likelihood of the first partition wall PW1 being etched in a manufacturing process for forming the light-emitting element LE and the partition wall PW.

The second partition wall PW2 may be located on the first partition wall PW1. The second partition wall PW2 may be formed of an inorganic film such as a silicon oxide ($SiO_2$) film, an aluminum oxide ($Al_2O_3$) film, or a hafnium oxide ($HfO_x$) film. A thickness Tpw2 of the second partition wall PW2 may be in a range of about 1 $\mu$m to about 2 $\mu$m.

The third partition wall PW3 may be located on the second partition wall PW2. The third partition wall PW3 may include a conductive material such as nickel (Ni). A thickness Tpw3 of the third partition wall PW3 may be in a range of about 0.01 $\mu$m to about 1 $\mu$m.

The second insulating film INS2 may be located on side surfaces of the common connection electrode CCE, side surfaces of the partition wall PW, side surfaces of each of the pixel electrodes 111, side surfaces of each of the connection electrodes 112, and side surfaces of each of the light-emitting elements LE. The second insulating film INS2 may be formed of an inorganic film such as a silicon oxide ($SiO_2$) film, an aluminum oxide ($Al_2O_3$) film, or a hafnium oxide ($HfO_x$) film. The second insulating film INS2 may have a thickness of about 0.1 μm.

The common electrode CE may be located on an upper surface and the side surfaces of each of the light-emitting elements LE, and on an upper surface and the side surfaces of the partition wall PW. That is, the common electrode CE may cover the upper surface and the side surfaces of each of the light-emitting elements LE and the upper surface and the side surfaces of the partition wall PW.

The common electrode CE may be in contact with the second insulating film INS2 that is located on the side surfaces of the common connection electrode CCE, the side surfaces of the partition wall PW, the side surfaces of each of the pixel electrodes 111, the side surfaces of each of connection electrodes 112, and the side surfaces of each of the light-emitting elements LE. In addition, the common electrode CE may be in contact with the upper surface of the common connection electrode CCE, the upper surface of each of the light-emitting elements LE, and the upper surface of the partition wall PW.

The common electrode CE may be in contact with the upper surface of the common connection electrode CCE and the upper surface of the light-emitting element LE, which are exposed without being covered by the second insulating film INS2. Thus, the common voltage supplied to the common connection electrode CCE may be applied to the light-emitting element LE. That is, one end of the light-emitting element LE may receive the pixel voltage or the anode voltage of the pixel electrode 111 through the connection electrode 112, and the other end thereof may receive the common voltage through the common electrode CE. The light-emitting element LE may emit light with a brightness (e.g., a predetermined brightness) according to a voltage difference between the pixel voltage and the common voltage.

The common electrode CE may include a transparent conductive material. The common electrode CE may be formed of a transparent conductive oxide (TCO) such as indium tin oxide (ITO) or indium zinc oxide (IZO). The common electrode CE may have a thickness of about 0.1 μm.

The reflective film RF serves to reflect light that travels in directions toward vertical and lateral side surfaces, instead of in an upward direction, among the light emitted from the light-emitting element LE. The reflective film RF may include a metal material having a high reflectivity, such as aluminum (Al). The reflective film RF may have a thickness of about 0.1 μm.

The reflective film RF may be located on the side surfaces of the common connection electrode CCE, the side surfaces of the partition wall PW, the side surfaces of each of the pixel electrodes 111, the side surfaces of each of the connection electrodes 112, and the side surfaces of each of the light-emitting elements LE (e.g., with the common electrode CE and the second insulating film INS2 therebetween). The reflective film RF may be in contact with the common electrode CE located on the side surfaces of the common connection electrode CCE, the side surfaces of the partition wall PW, the side surfaces of each of the pixel electrodes 111, the side surfaces of each of the connection electrodes 112, and the side surfaces of each of the light-emitting elements LE.

In each of the first light-emitting areas EA1, the second light-emitting areas EA2, and the third light-emitting areas EA3, the wavelength conversion layer QDL may be located on the light-emitting element LE. The wavelength conversion layer QDL may convert a portion of the first light incident from the light-emitting element LE into fourth light, and may emit the fourth light. For example, the fourth light may be light of a yellow wavelength band. The fourth light may be light including both light of a green wavelength band and light of a red wavelength band. That is, the fourth light may be mixed light of the second light and the third light.

The wavelength conversion layer QDL may include a base resin BRS and wavelength conversion particles WCP. The base resin BRS may include a transparent organic material. For example, the base resin BRS may include an epoxy-based resin, an acrylic-based resin, a cardo-based resin, an imide-based resin, or the like.

The wavelength conversion particles WCP may convert the first light incident from the light-emitting element LE into the fourth light. For example, the wavelength conversion particles WCP may convert light of a blue wavelength band into light of a yellow wavelength band. The wavelength conversion particle WCP may be a quantum dot (QD), a quantum rod, a fluorescent material, or a phosphorescent material. The quantum dot may include group IV-based nanocrystals, group II-VI-based compound nanocrystals, group III-V-based compound nanocrystals, group IV-VI-based nanocrystals, or combinations thereof.

The quantum dot may include a core and a shell overcoating the core. The core may include, but is not limited to, at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may include, but is not limited to, at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The display panel of the display device according to some embodiments may further include a capping layer CAL located on or above the partition wall PW and the wavelength conversion layer QDL. The capping layer CAL may be located on or over the entire surface of the display panel. The capping layer CAL may be in direct contact with each of the wavelength conversion layer QDL and the common electrode CE located on the partition wall PW. The capping layer CAL may reduce or prevent external air and moisture from penetrating into the wavelength conversion layer QDL. The capping layer CAL may include an inorganic insulating material. The inorganic insulating material may include a silicon oxide ($SiO_2$) film, an aluminum oxide ($Al_2O_3$) film, or a hafnium oxide ($HfO_x$) film, but the present disclosure is not limited thereto.

The optical member RP may be located on the capping layer CAL. The optical member RP may include an optical layer HRP overlapping the wavelength conversion layer QDL and the partition wall PW, and an optical pattern LRP overlapping the partition wall PW. The optical layer HRP may overlap the optical pattern LRP. For example, the optical layer HRP may completely overlap the optical pattern LRP. A cross-sectional shape of the optical pattern LRP may be a protruding shape protruding upward. For example, the cross-sectional shape of the optical pattern LRP may be a convex lens shape that is convex upward, but the present disclosure is not limited thereto. The optical layer HRP may be in direct contact with a surface of the optical pattern LRP having a convex lens shape that is convex upward, and may completely cover the surface of the optical pattern LRP.

Each of the optical layer HRP and the optical pattern LRP may include an organic insulating material. Refractive indices of the optical pattern LRP and the optical layer HRP may be different from each other. In some embodiments, the refractive index of the optical layer HRP may be greater than the refractive index of the optical pattern LRP. That is, the optical layer HRP may include a high refractive organic insulating material, and the optical pattern LRP may include a low refractive organic insulating material.

The optical member RP according to some embodiments includes the optical pattern LRP having a relatively low refractive index and the optical layer HRP having a relatively high refractive index, the optical pattern LRP is located to overlap the partition wall PW, and the optical layer HRP is located to completely cover the optical pattern LRP, thereby improving light emission efficiency of the display device. The improvement of the light emission efficiency of the optical member RP and the shape of the optical pattern LRP according to some embodiments will be described in detail with reference to FIGS. 8 and 9.

Figure 8:
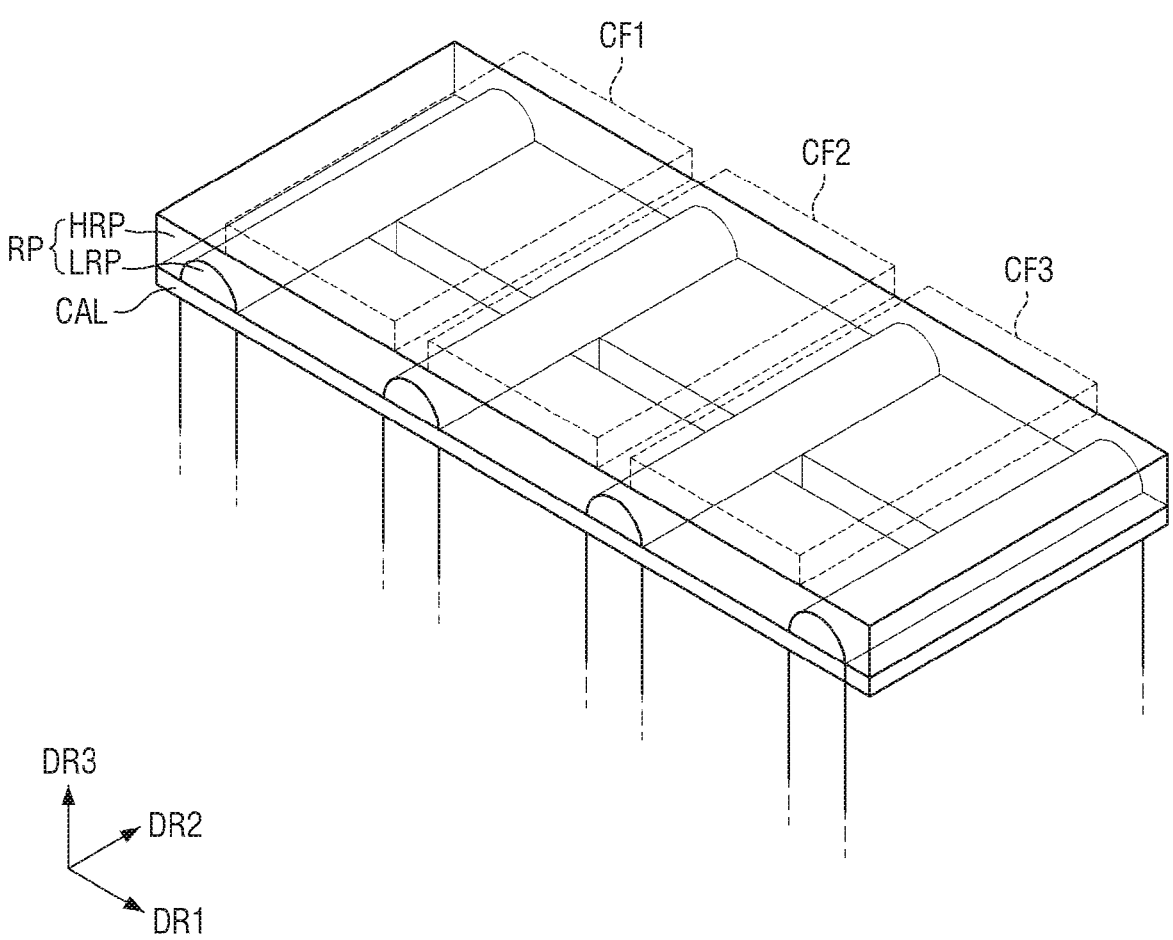
FIG. 8 is a perspective view illustrating a capping layer and an optical member of FIG. 5.
Figure 9:
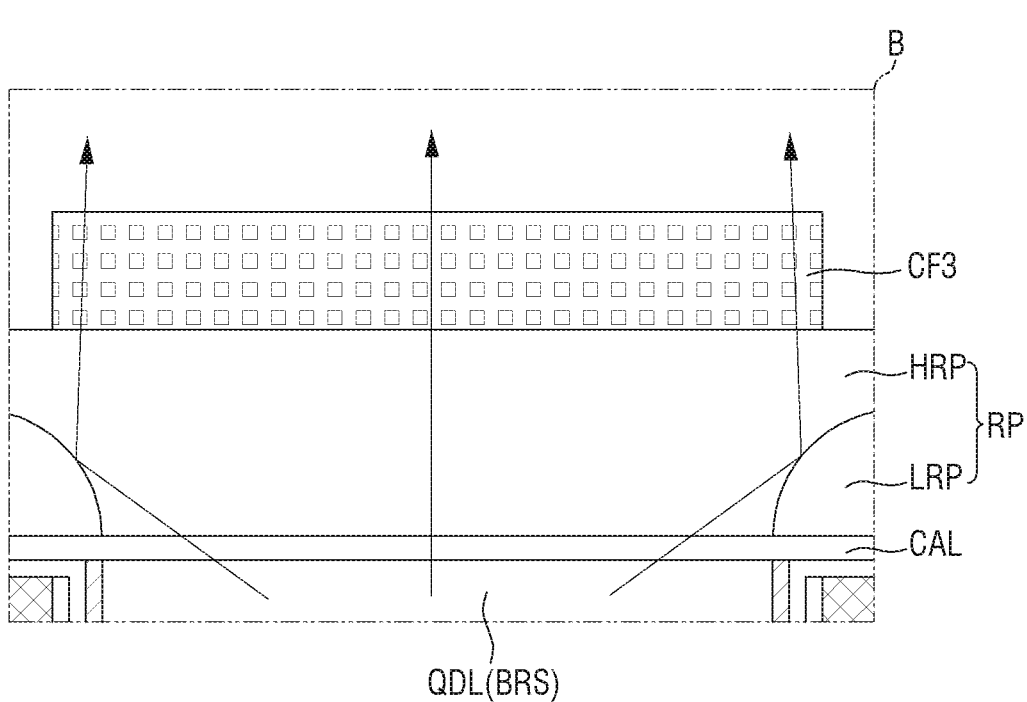
FIG. 9 is an enlarged cross-sectional view of area B of FIG. 5.

FIG. 8 is a perspective view illustrating the capping layer and the optical member of FIG. 5. FIG. 9 is an enlarged cross-sectional view of area B of FIG. 5.

Referring to FIGS. 5 and 8, the optical pattern LRP of the optical member RP according to some embodiments may have a line shape extending along one direction. For example, the optical pattern LRP may have a line shape extending along the second direction DR2. Optical patterns LRP may be respectively located between adjacent light-emitting areas EA1, EA2, and EA3. However, unlike that shown in FIG. 8, the optical pattern LRP may be formed of a plurality of island patterns respectively located between adjacent light-emitting areas EA1, EA2, and EA3 to be spaced apart from each other along the second direction DR2.

As shown in FIG. 9, light that is emitted from the light-emitting element LE and passes through the optical layer HRP may be totally reflected at an interface between the optical layer HRP and the optical pattern LRP. Thus, the light emission efficiency may be improved by inducing light to be condensed at a center portion of each of the light-emitting areas EA1, EA2, and EA3.

Referring to FIGS. 4 and 5 again, the plurality of color filters CF1, CF2, and CF3 may include first color filters CF1, second color filters CF2, and third color filters CF3. The plurality of color filters CF1, CF2, and CF3 may be located on the optical member RP.

Each of the first color filters CF1 may be located on the optical member RP in the first light-emitting area EA1. In addition, each of the first color filters CF1 may be located on the partition wall PW. Each of the first color filters CF1 may transmit the first light, and may absorb or block the fourth light. For example, each of the first color filters CF1 may transmit light of a blue wavelength band, and may absorb or block light in green and red wavelength bands. Accordingly, each of the first color filters CF1 may transmit the first light that is not converted by the wavelength conversion layer QDL among the first light emitted from the light-emitting element LE, and may absorb or block the fourth light converted by the wavelength conversion layer QDL. Thus, each of the first light-emitting areas EA1 may emit the first light.

Each of the second color filters CF2 may be located on the optical member RP in the second light-emitting area EA2. In addition, each of the second color filters CF2 may be located on the partition wall PW. Each of the second color filters CF2 may transmit the second light, and may absorb or block the first light and the third light. For example, each of the second color filters CF2 may transmit light of a green wavelength band, and may absorb or block light in blue and red wavelength bands. Accordingly, each of the second color filters CF2 may absorb or block the first light that is not converted by the wavelength conversion layer QDL among the first light emitted from the light-emitting element LE. In addition, each of the second color filters CF2 may transmit the second light corresponding to a green wavelength band among the fourth light converted by the wavelength conversion layer QDL, and may absorb or block the third light corresponding to a red wavelength band. Thus, each of the second light-emitting areas EA2 may emit the second light.

Each of the third color filters CF3 may be located on the optical member RP in the third light-emitting area EA3. In addition, each of the third color filters CF3 may be located on the partition wall PW. Each of the third color filters CF3 may transmit the third light, and may absorb or block the first light and the second light. For example, each of the third color filters CF3 may transmit light of a red wavelength band, and may absorb or block light in blue and green wavelength bands. Accordingly, each of the third color filters CF3 may absorb or block the first light that is not converted by the wavelength conversion layer QDL among the first light emitted from the light-emitting element LE. In addition, each of the third color filters CF3 may transmit the third light corresponding to a red wavelength band among the fourth light converted by the wavelength conversion layer QDL, and may absorb or block the second light corresponding to a green wavelength band. Thus, each of the third light-emitting areas EA3 may emit the third light.

Figure 10:
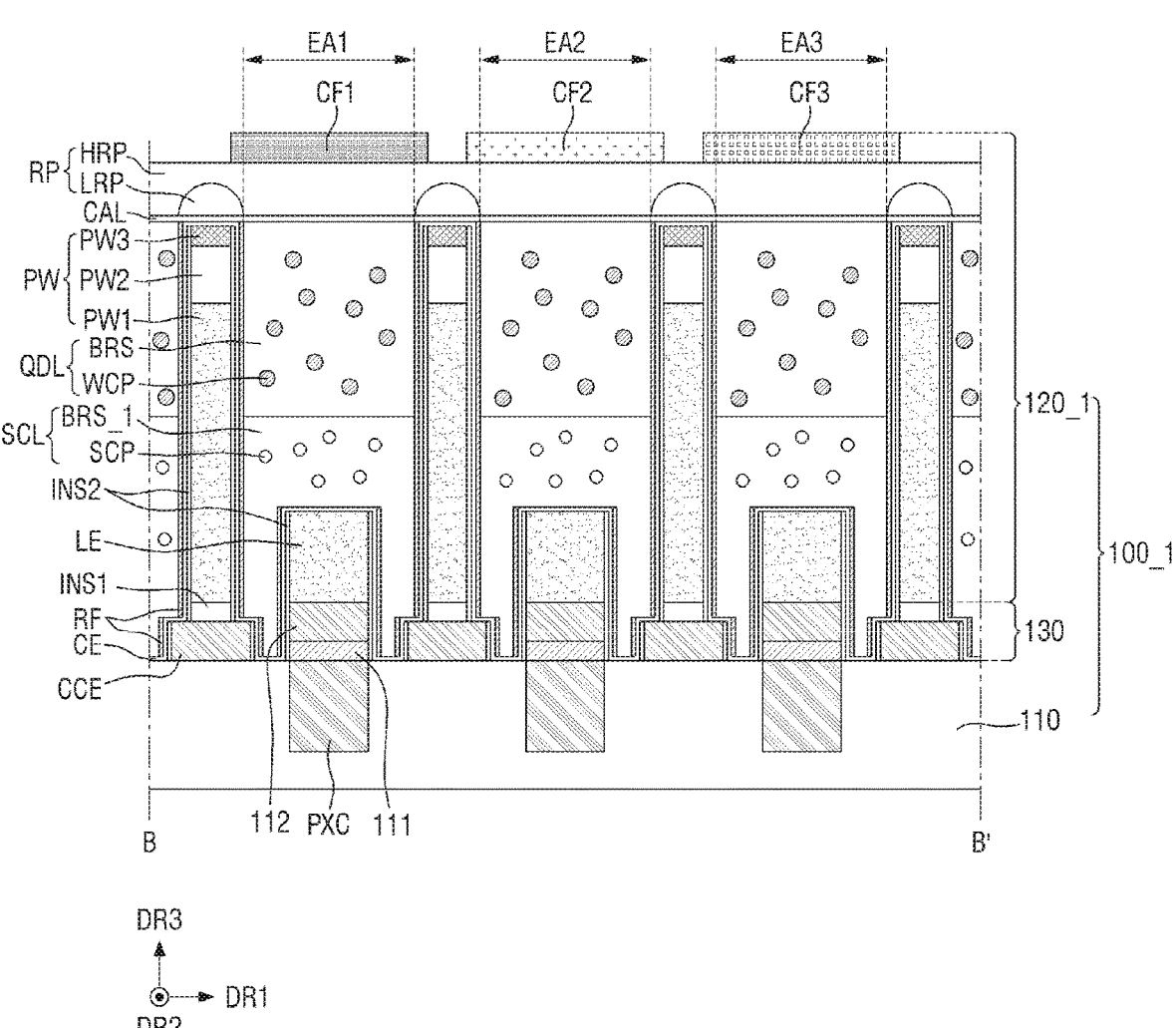
FIG. 10 is a cross-sectional view of a display panel according to other embodiments.

FIG. 10 is a cross-sectional view of a display panel according to other embodiments.

Referring to FIG. 10, a display panel 100_1 according to some embodiments is different from the display panel 100 described with reference to FIG. 5 in that a light-emitting element layer 120_1 of the display panel 100_1 further includes a light scattering layer SCL. The light scattering layer SCL may include a base resin BRS_1 and scattering particles SCP. The base resin BRS_1 may include a transparent organic material. The light scattering layer SCL may scatter light emitted from a light-emitting element LE. In addition, the light scattering layer SCL may be located between the light-emitting element LE and a wavelength conversion layer QDL to reduce or prevent damage to the wavelength conversion layer QDL due to heat generated from the light-emitting element LE.

Because other features have been described above with reference to FIG. 5, a repeated detailed description thereof will be omitted below.

Figure 11:
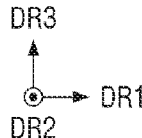
FIG. 11 is a cross-sectional view of a display panel according to still other embodiments.

FIG. 11 is a cross-sectional view of a display panel according to still other embodiments.

Referring to FIG. 11, a display panel 100_2 according to some embodiments is different from the display panel 100 described with reference to FIG. 5 in that the wavelength conversion layer QDL of FIG. 5 is omitted from a light-emitting element layer 120_2 of the display panel 100_2, and a light conversion layer is located in an area in which the wavelength conversion layer QDL of FIG. 5 is located.

For example, the light conversion layer may include a base resin BRS (or light transmission layer) located in a first light-emitting area EA1, a first wavelength conversion layer QDL_G located in a second light-emitting area EA2, and a second wavelength conversion layer QDL_R located in a third light-emitting area EA3. Each of the first and second wavelength conversion layers QDL_G and QDL_R may include the base resin BRS. The first wavelength conversion layer QDL_G may include first wavelength conversion patterns WCP_G dispersed in the base resin BRS, and the second wavelength conversion layer QDL_R may include second wavelength conversion patterns WCP_R dispersed in the base resin BRS. The first wavelength conversion patterns WCP_G may wavelength-convert first light into second light, and the second wavelength conversion patterns WCP_R may wavelength-convert the first light into third light.

Because other features have been described above with reference to FIG. 5, a repeated detailed description thereof will be omitted below.

Figure 12:
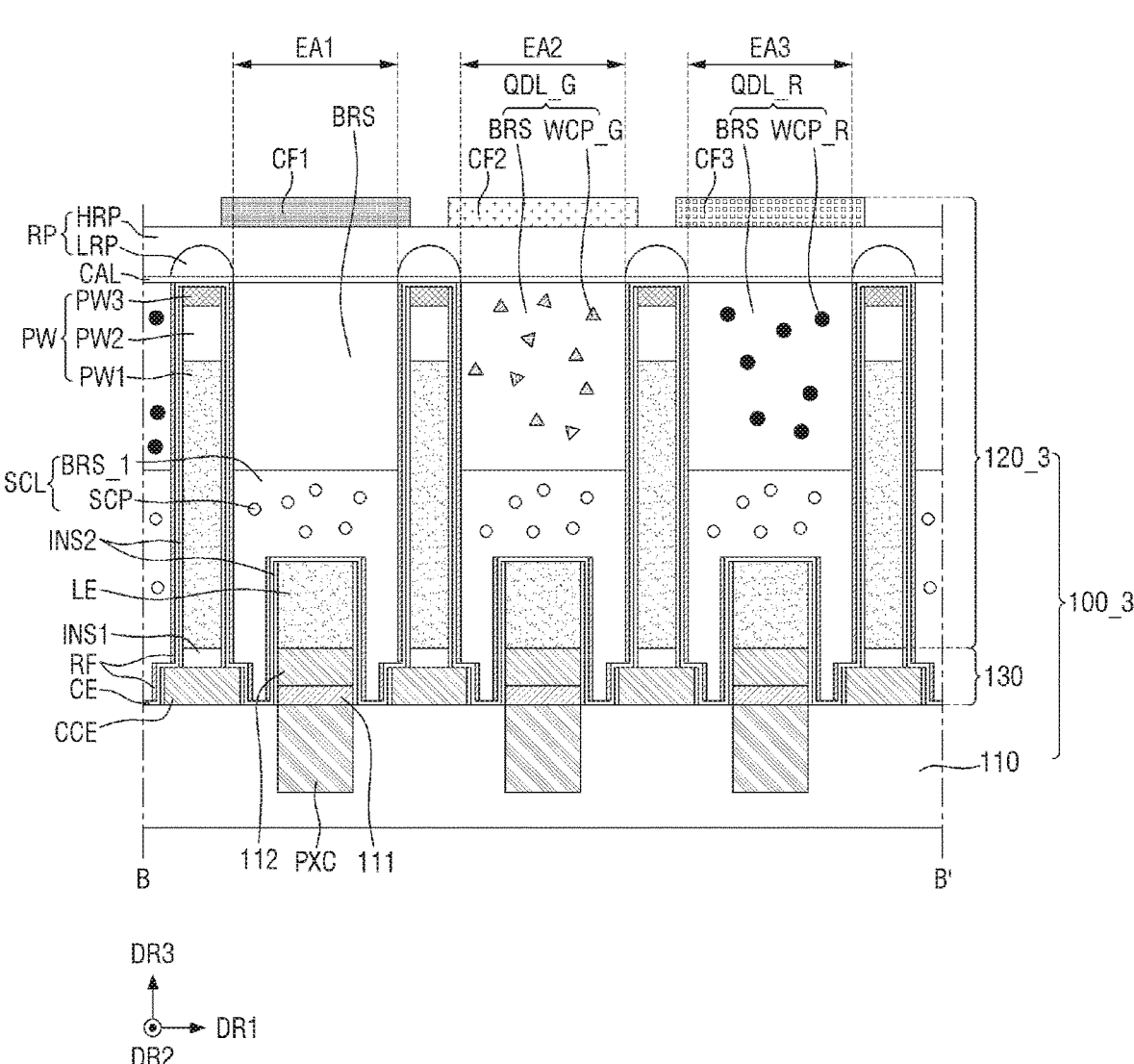
FIG. 12 is a cross-sectional view of a display panel according to yet other embodiments.

FIG. 12 is a cross-sectional view of a display panel according to yet other embodiments.

Referring to FIG. 12, a display panel 100_3 according to some embodiments is different from the display panel 100_2 described with reference to FIG. 11 in that a light-emitting element layer 120_3 of the display panel 100_3 further includes a light scattering layer SCL.

The light scattering layer SCL may be located between a base resin BRS and a light-emitting element LE, between a first wavelength conversion layer QDL_G and the light-emitting element LE, and/or between a second wavelength conversion layer QDL_R and the light-emitting element LE (e.g., respectively). The light scattering layer SCL has been described in detail with reference to FIG. 10, and other features have been described above with reference to FIG. 5, and thus a repeated detailed description thereof will be omitted below.

Figure 13:
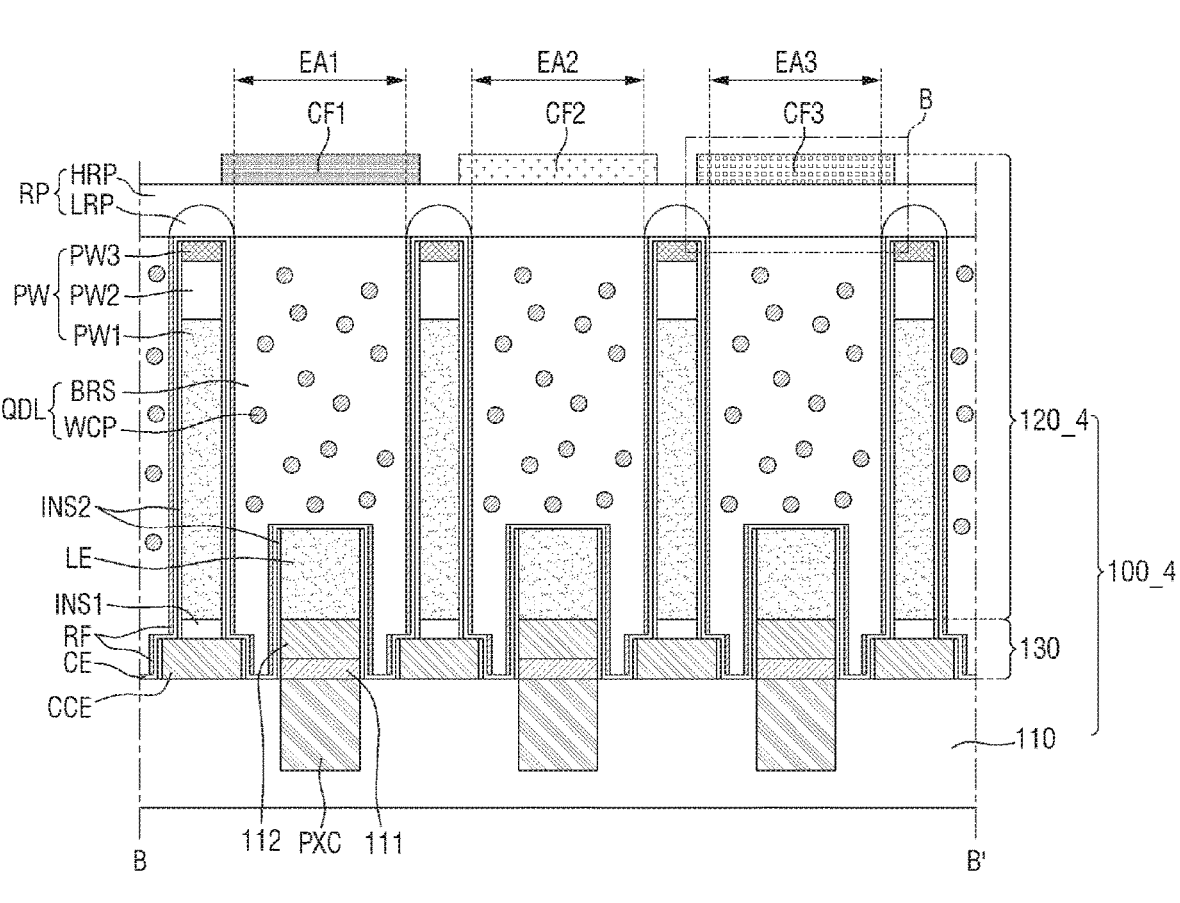
FIG. 13 is a cross-sectional view of a display panel according to yet other embodiments.
Figure 13:
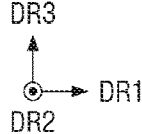

FIG. 13 is a cross-sectional view of a display panel according to yet other embodiments.

Referring to FIG. 13, a display panel 100_4 according to some embodiments is different from the display panel 100 described with reference to FIG. 5 in that the capping layer CAL is omitted from a light-emitting element layer 120_4 of the display panel 100_4. Accordingly, an optical pattern LRP may be located directly on a common electrode CE located on a partition wall PW, and an optical layer HRP may be located directly on a wavelength conversion layer QDL.

Because other features have been described above with reference to FIG. 5, a repeated detailed description thereof will be omitted below.

Figure 14:
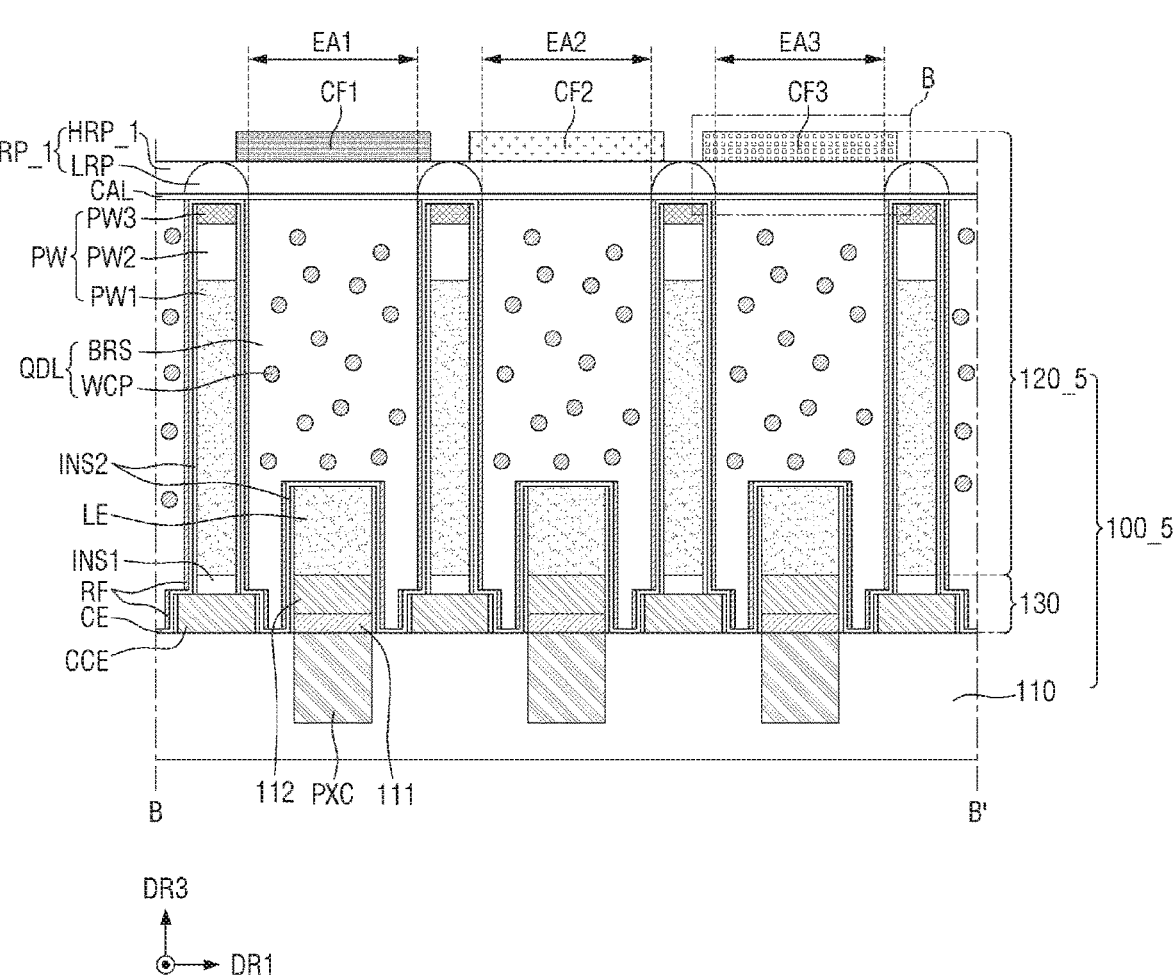
FIG. 14 is a cross-sectional view of a display panel according to yet other embodiments.

FIG. 14 is a cross-sectional view of a display panel according to yet other embodiments.

Referring to FIG. 14, a display panel 100_5 according to some embodiments is different from the display panel 100 described with reference to FIG. 5 in that in an optical member RP_1 of a light-emitting element layer 120_5 of the display panel 100_5, a maximum surface height of an optical pattern LRP is designed to be the same as a surface height of an optical layer HRP_1.

Because other features have been described above with reference to FIG. 5, a repeated detailed description thereof will be omitted below.

Figure 15:
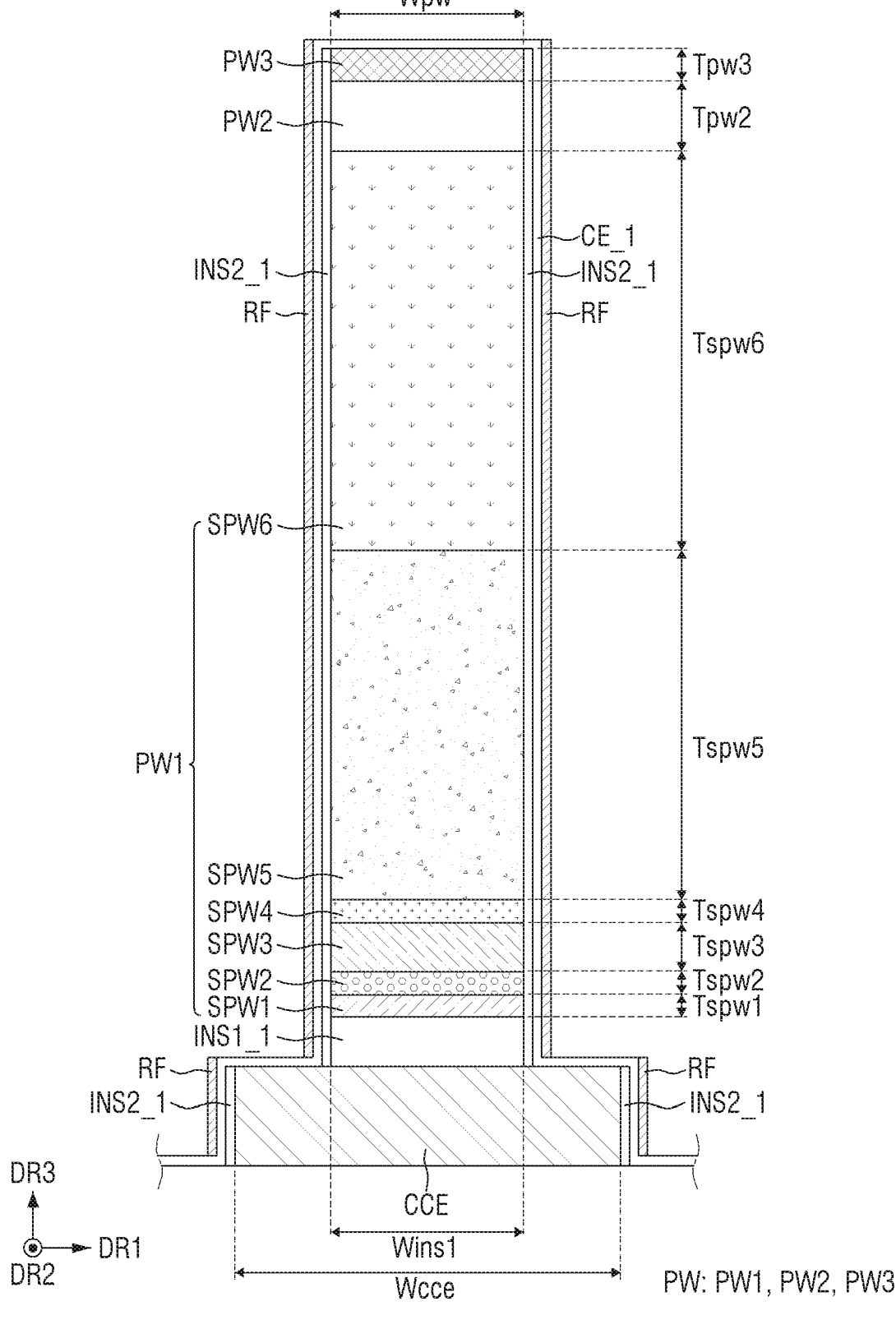
FIG. 15 is an enlarged cross-sectional view illustrating another example of the partition wall of FIG. 5 in detail.

FIG. 15 is an enlarged cross-sectional view illustrating another example of the partition wall of FIG. 5 in detail.

Referring to FIG. 15, the present embodiments are different from the embodiments described with reference to FIG. 7 in that a first insulating film INS1_1 completely covers the upper surface of the common connection electrode CCE. The redundant description of the embodiments described with reference to FIG. 7 will be omitted with respect to FIG. 15.

Referring to FIG. 15, the first insulating film INS1_1 may be located on the upper surface of the common connection electrode CCE. Because the first insulating film INS1_1 completely covers the upper surface of the common connection electrode CCE, the upper surface of the common connection electrode CCE may not be exposed. Accordingly, a common electrode CE_1 is in contact with an upper surface of the first insulating film INS1_1, and might not be in contact with the upper surface of the common connection electrode CCE. In this case, the common electrode CE_1 may be connected to a common voltage supply portion in the non-display area NDA to receive the common voltage.

A second insulating film INS2_1 may be located on side surfaces of the first insulating film INS1_1, and the reflective film RF may be located on the common electrode CE_1 located on the side surfaces of the first insulating film INS1_1.

Figure 16:
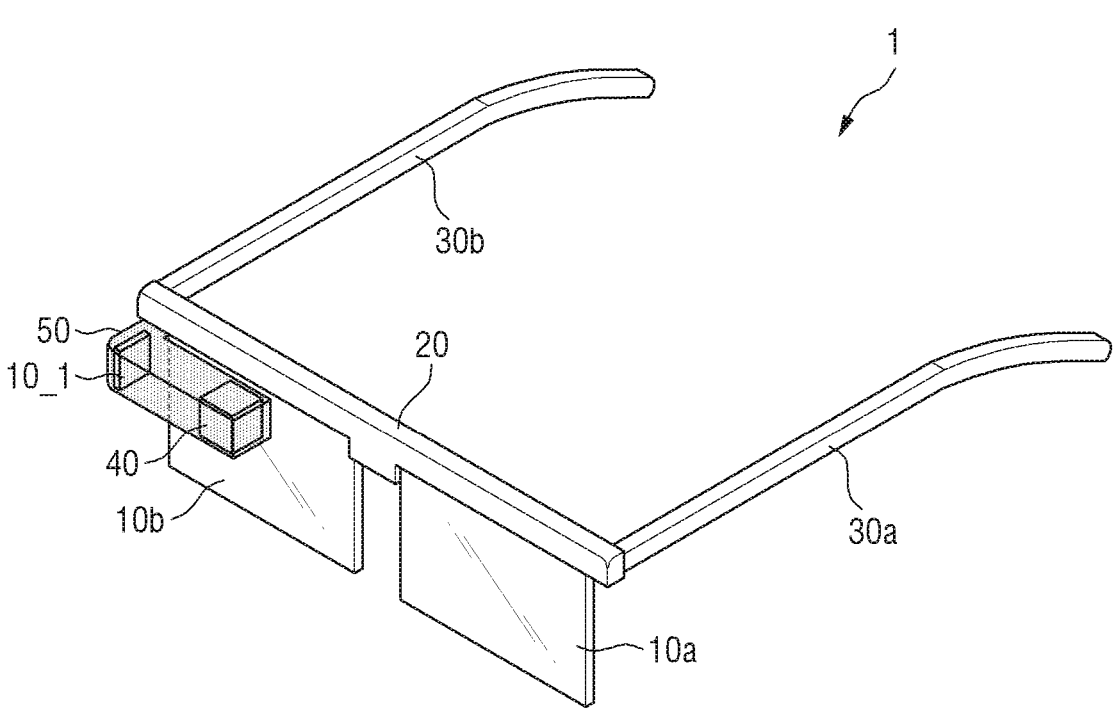
FIG. 16 is a view illustrating a virtual reality device including a display device according to some embodiments.

FIG. 16 is a view illustrating a virtual reality device including a display device according to some embodiments.

FIG. 16 illustrates a virtual reality device 1 to which a display device 10_1 according to some embodiments is applied.

Referring to FIG. 16, the virtual reality device 1 according to some embodiments may be a glasses-type device. The virtual reality device 1 according to some embodiments may include the display device 10_1, a left-eye lens 10a, a right-eye lens 10b, a support frame 20, frame legs 30a and 30b, a reflecting member 40, and a display device accommodating portion 50.

FIG. 16 illustrates the virtual reality device 1 including the frame legs 30a and 30b, but the virtual reality device 1 according to some embodiments may also be applied to a head-mounted display including a head mounting band, which may be mounted onto a head, in place of the frame legs 30a and 30b. That is, the virtual reality device 1 according to some embodiments is not limited to that shown in FIG. 16, and is applicable to various other electronic devices in various forms.

The display device accommodating portion 50 may include the display device 10_1 and the reflecting member 40. An image displayed on the display device 10_1 may be reflected by the reflecting member 40 and provided to a right eye of a user through the right-eye lens 10b. Accordingly, the user may view a virtual reality image displayed on the display device 10_1 through the right eye.

In FIG. 16, the display device accommodating portion 50 is illustrated as being located on a right end of the support frame 20, but the present specification is not limited thereto. For example, the display device accommodating portion 50 may be located on a left end of the support frame 20, and in this case, the image displayed on the display device 10_1 may be reflected by the reflecting member 40 and provided to a left eye of the user through the left-eye lens 10a. Accordingly, the user may view the virtual reality image displayed on the display device 10_1 through the left eye. Alternatively, the display device accommodating portion 50 may be located at both the left end and the right end of the support frame 20, and in this case, the user may view the virtual reality image displayed on the display device 10_1 through both the left and right eyes.

Figure 17:
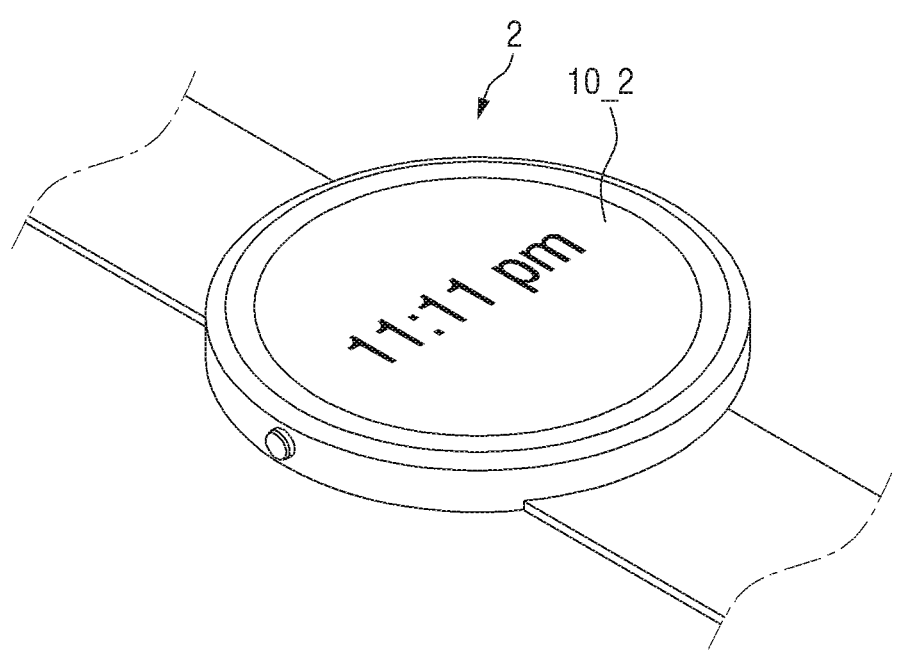
FIG. 17 is a view illustrating a smart device including a display device according to some embodiments.

FIG. 17 is a view illustrating a smart device including a display device according to some embodiments.

Referring to FIG. 17, a display device 10_2 according to some embodiments may be applied to a smart watch 2, which is one among smart devices.

Figure 18:
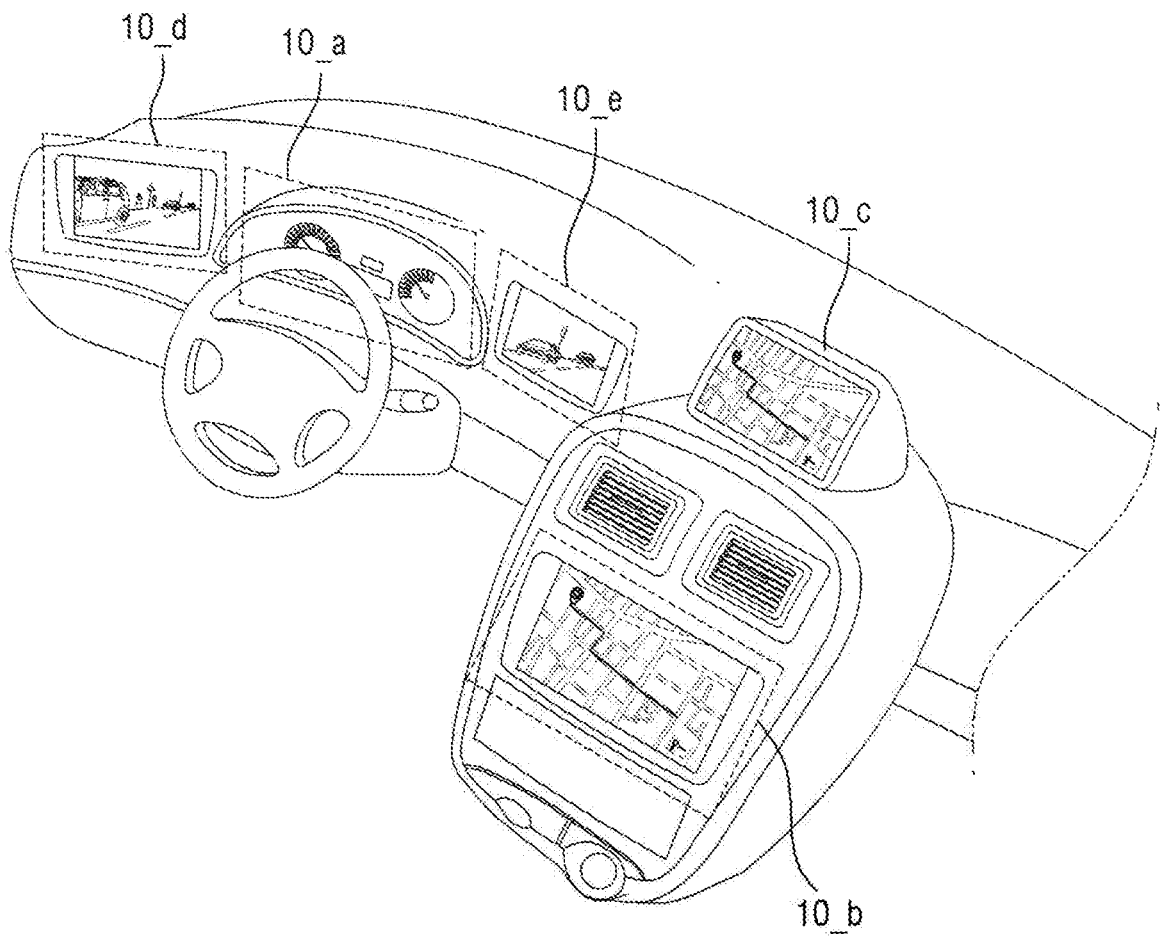
FIG. 18 is a view illustrating a dashboard and a center fascia of a vehicle, which include display devices according to some embodiments.

FIG. 18 is a view illustrating a dashboard and a center fascia of a vehicle, which include display devices according to some embodiments.

FIG. 18 illustrates a vehicle to which display devices 10_a, 10_b, 10_c, 10_d, and 10_e according to some embodiments are applied.

Referring to FIG. 18, the display devices 10_a, 10_b, and 10_c according to some embodiments may be applied to a dashboard of the vehicle, applied to a center fascia of the vehicle, or applied to a center information display (CID) located on the dashboard of the vehicle. In addition, the display devices 10_d and 10_e according to some embodiments may be applied to a room mirror display that replaces side mirrors of the vehicle.

Figure 19:
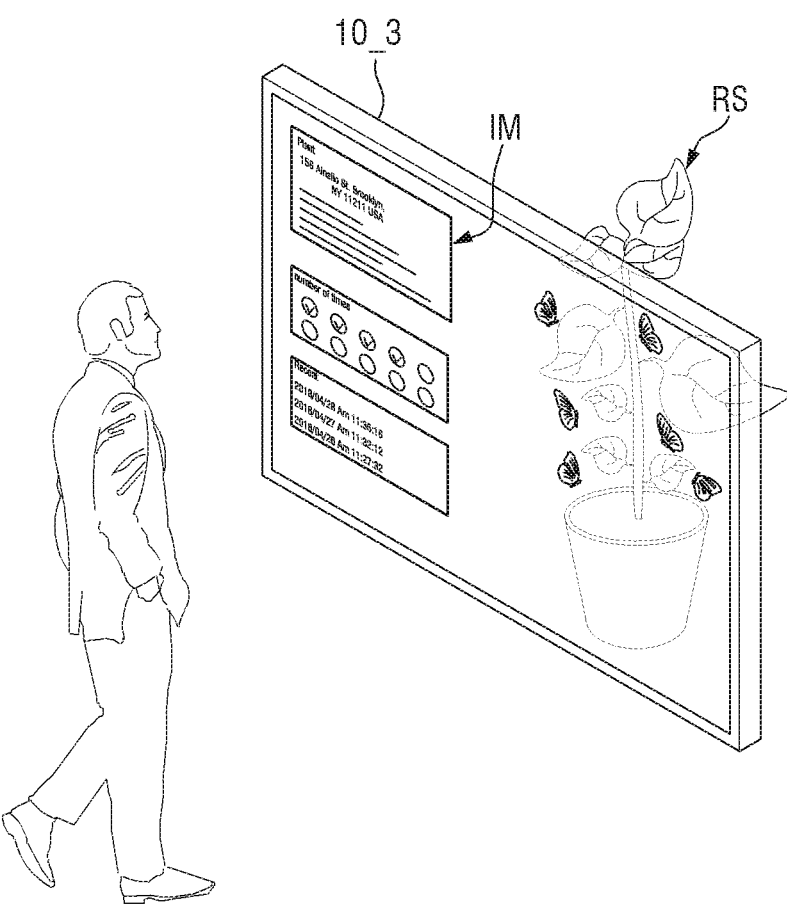
FIG. 19 is a view illustrating a transparent display device including a display device according to some embodiments.

FIG. 19 is a view illustrating a transparent display device including a display device according to some embodiments.

Referring to FIG. 19, a display device 10_3 according to some embodiments may be applied to a transparent display device. The transparent display device may transmit light while displaying an image IM. Thus, a user located on a front surface side of the transparent display device may view the image IM displayed on the display device 10_3 as well as an object RS or a background located on a rear surface side of the transparent display device. When the display device 10_3 is applied to the transparent display device, a substrate SUB1 of the display device 10_3 shown in FIGS. 4 and 5 may include a light transmission portion capable of transmitting light, or may be formed of a material capable of transmitting light.

Figure 20:
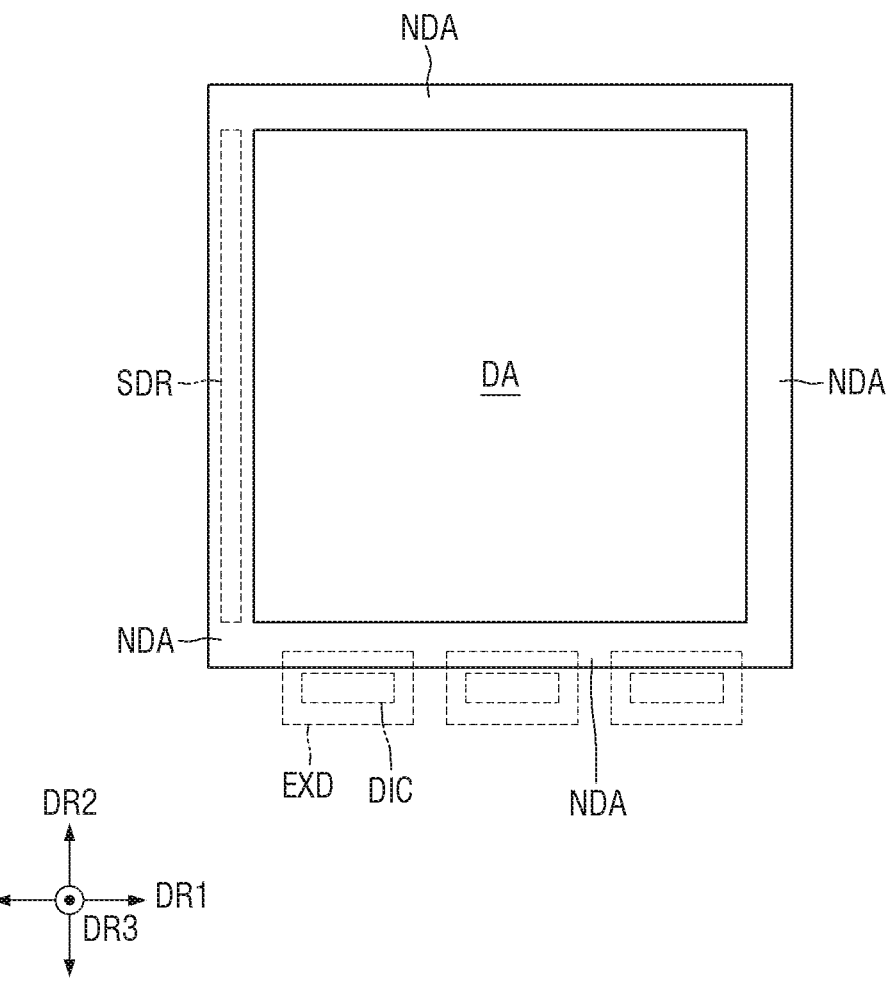
FIG. 20 is a layout diagram illustrating a display device according to yet other embodiments.
Figure 21:
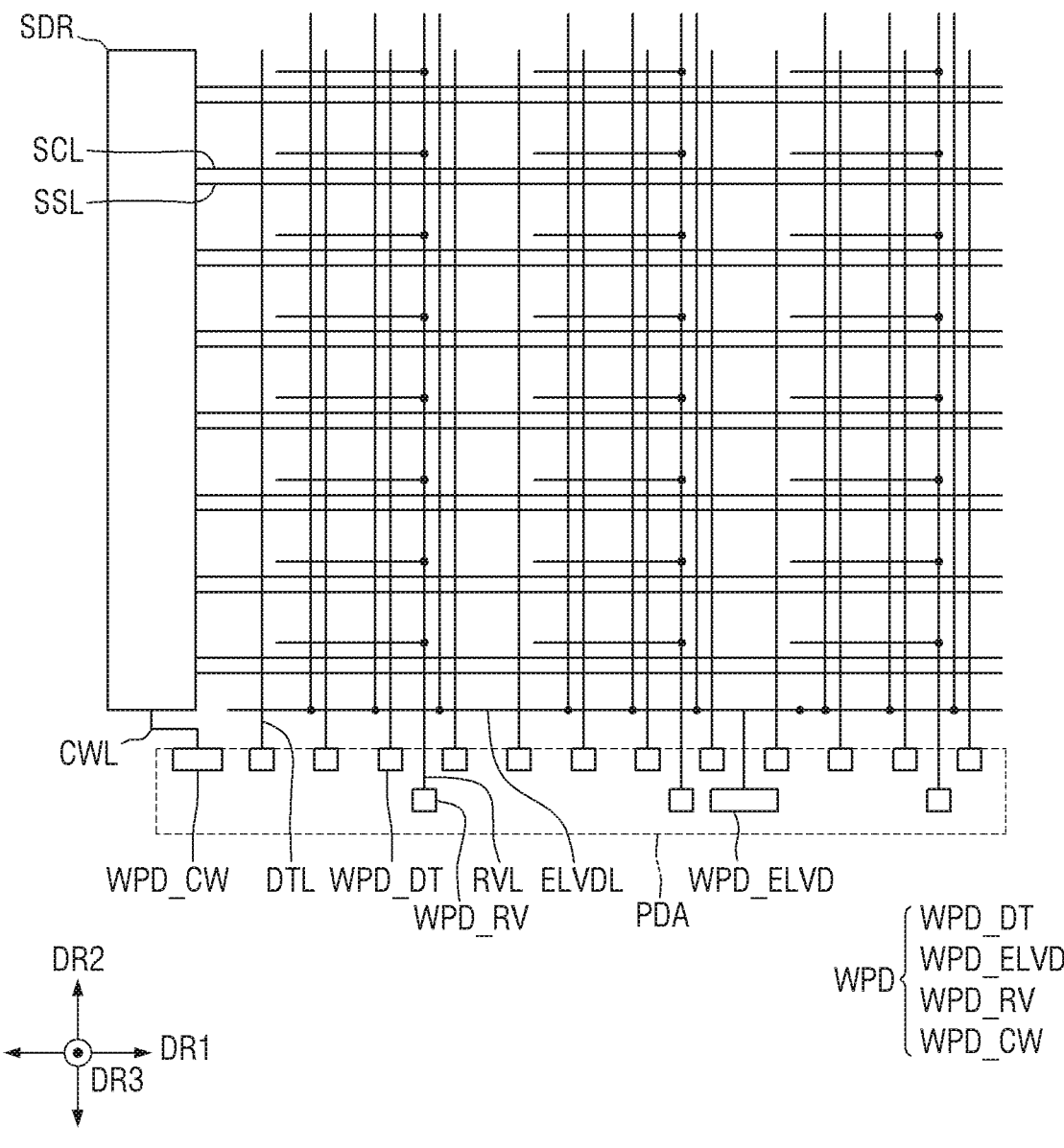
FIG. 21 is a schematic layout diagram of a circuit of the display device of FIG. 20.
Figure 22:
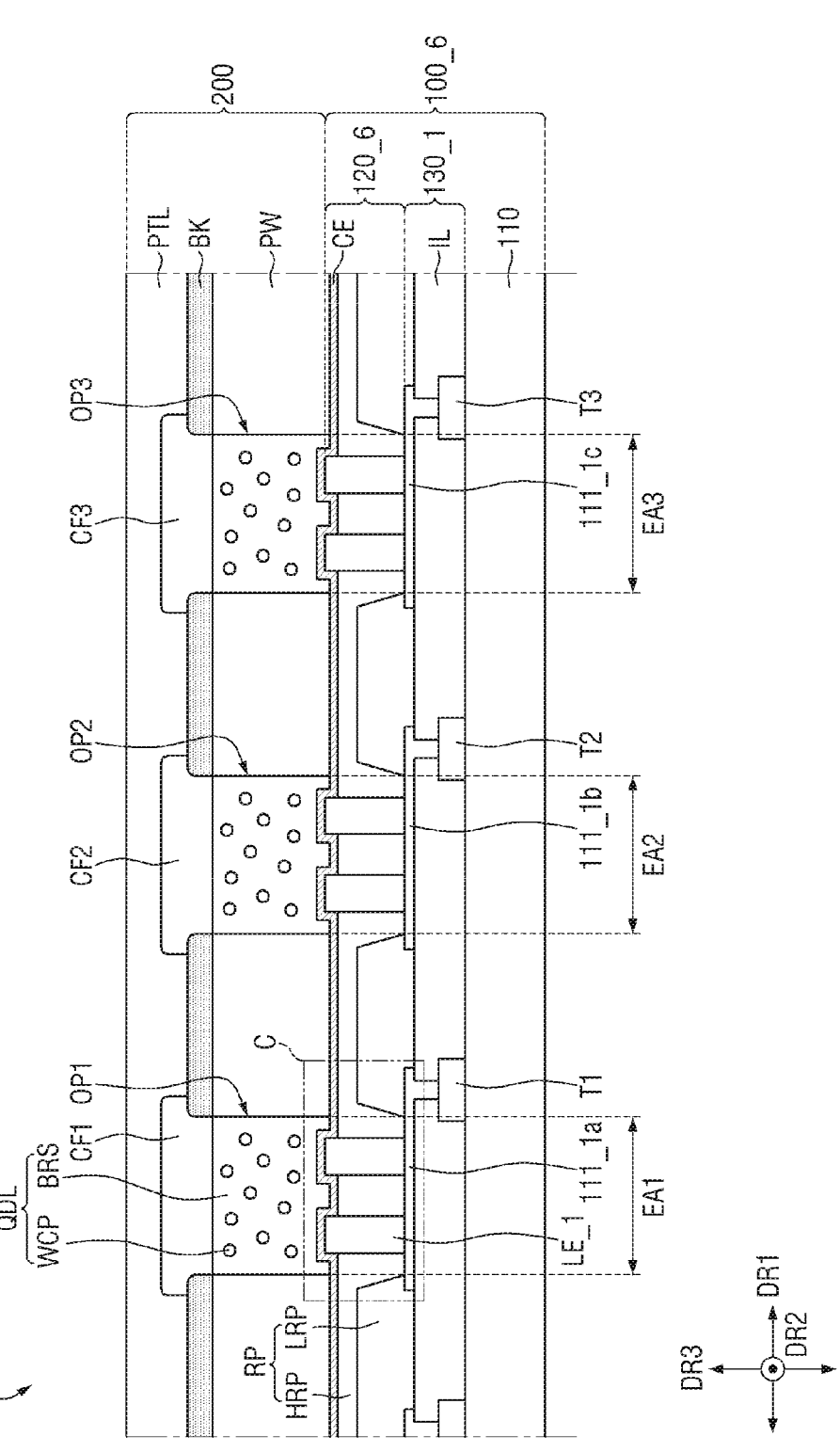
FIG. 22 is a cross-sectional view of a display panel of the display device of FIG. 20.
Figure 23:
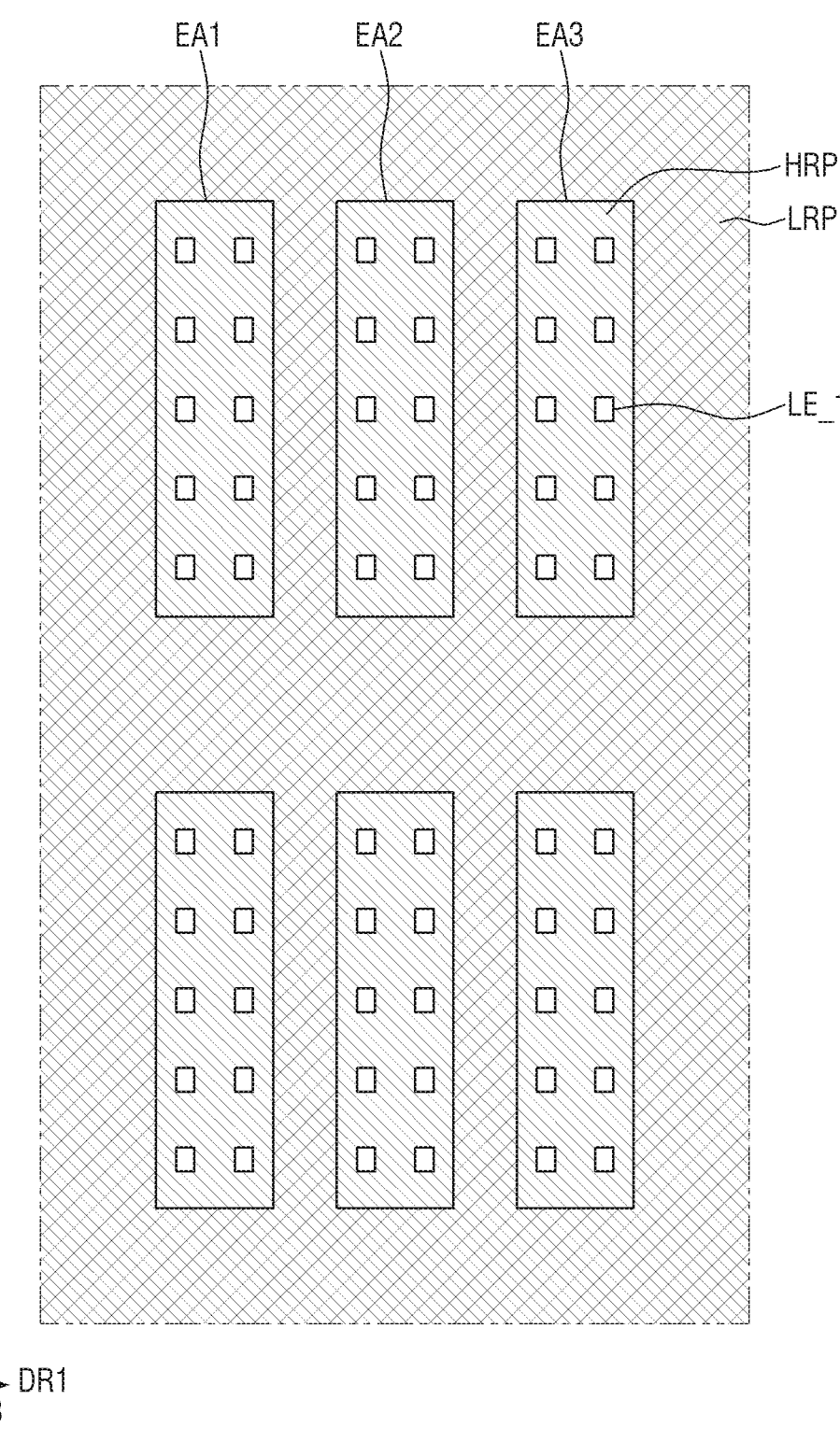
FIG. 23 is a plan view illustrating light-emitting areas, light-emitting elements, and an optical member of the display panel of FIG. 22.
Figure 24:
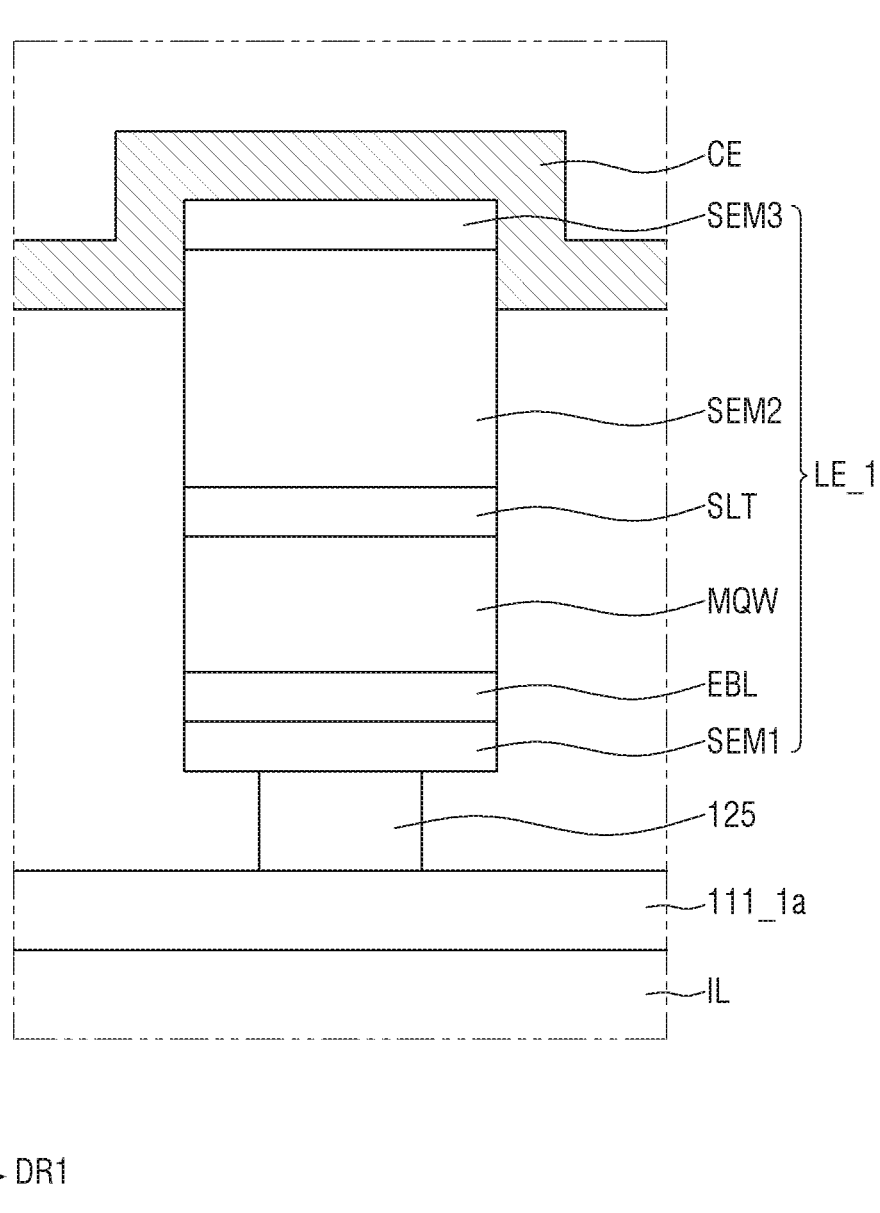
FIG. 24 is a cross-sectional view of the light-emitting element, a first pixel electrode, and a common electrode of FIG. 22.
Figure 25:
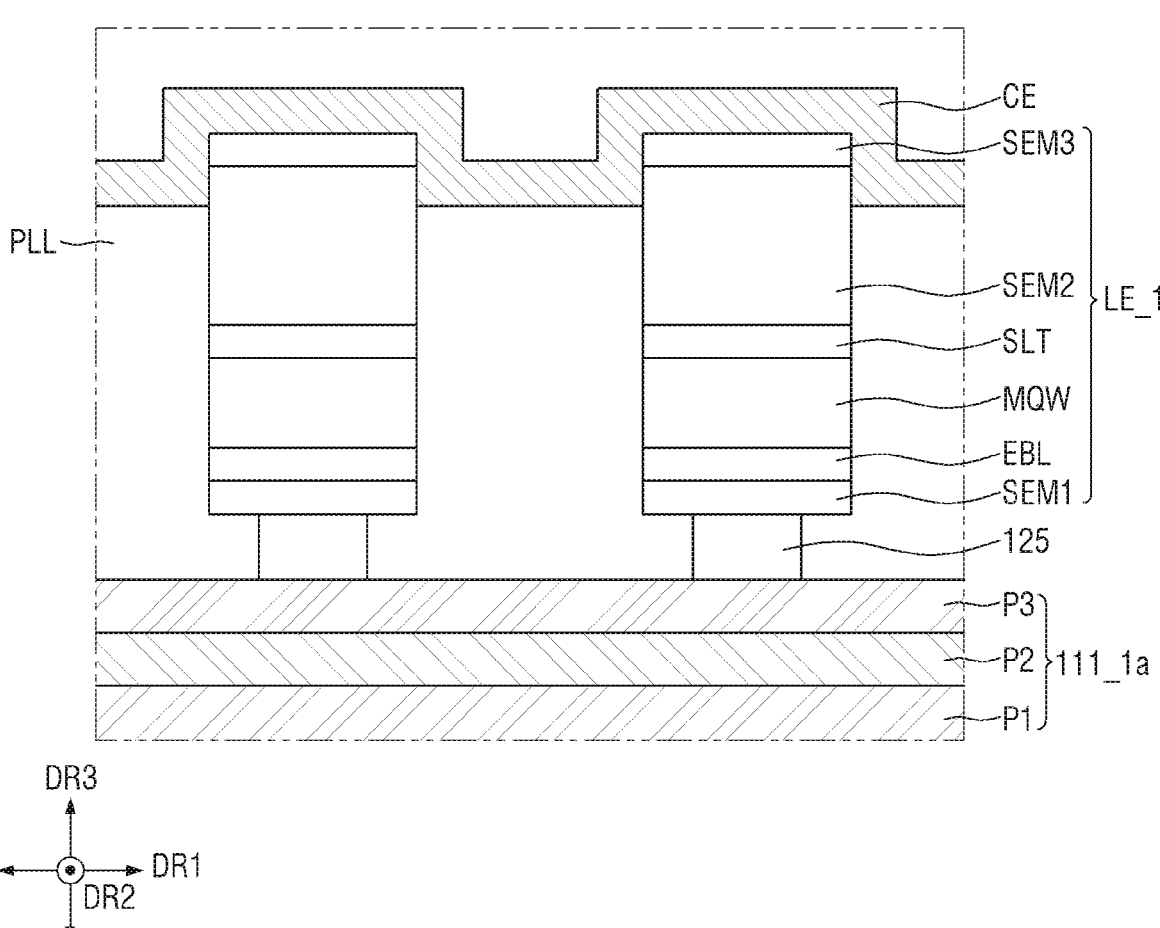
FIG. 25 is a cross-sectional view illustrating FIG. 24 in more detail.
Figure 26:
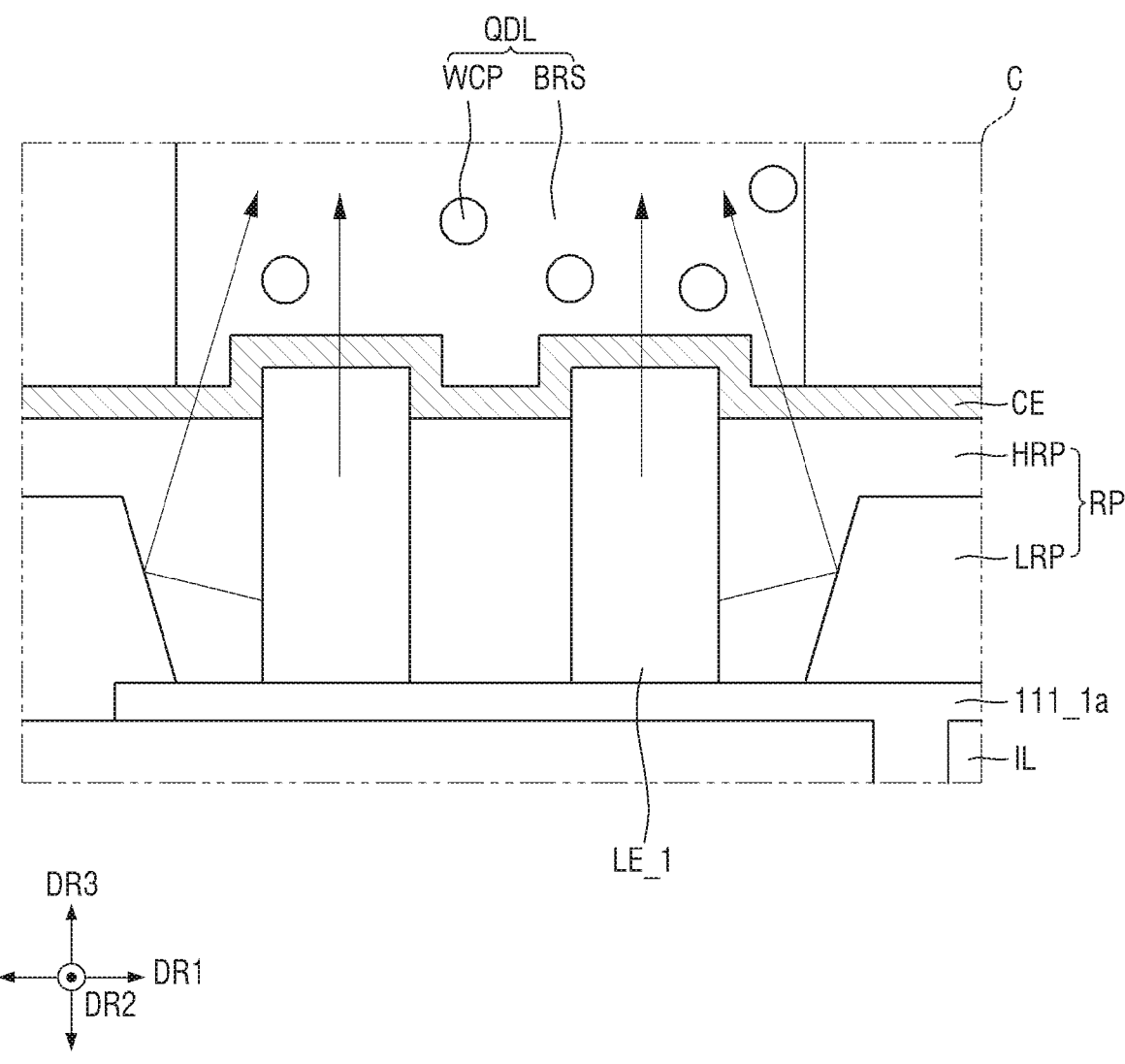
FIG. 26 is an enlarged cross-sectional view illustrating area C of FIG. 22.

FIG. 20 is a layout diagram illustrating a display device according to yet other embodiments. FIG. 21 is a schematic layout diagram of a circuit of the display device of FIG. 20. FIG. 22 is a cross-sectional view of a display panel of the display device of FIG. 20. FIG. 23 is a plan view illustrating light-emitting areas, light-emitting elements, and an optical member of the display panel of FIG. 22. FIG. 24 is a cross-sectional view of the light-emitting element, a first pixel electrode, and a common electrode of FIG. 22. FIG. 25 is a cross-sectional view illustrating FIG. 24 in more detail. FIG. 26 is an enlarged cross-sectional view illustrating area C of FIG. 22.

In FIG. 20, it is illustrated that an external device EXD is further mounted in a non-display area NDA of the display device according to some embodiments. Examples of the external device EXD may include a connection film, a printed circuit board, a driver chip (DIC), a connector, a line connection film, and the like. In addition, it is illustrated that a scan driver SDR may be further located in the non-display area NDA.

As shown in FIG. 21, a plurality of lines are located on a substrate. The plurality of lines may include a scan line SCL, a sensing signal line SSL, a data line DTL, a reference voltage line RVL, a first power line ELVDL, and the like.

The scan line SCL and the sensing signal line SSL may extend in a first direction DR1. The scan line SCL and the sensing signal line SSL may be connected to the scan driver SDR. The scan driver SDR may include a driving circuit. The scan driver SDR may be located on one side of the non-display area NDA on the substrate, but is not limited thereto and may be located on both sides of the non-display area NDA. The scan driver SDR may be connected to a signal connection line CWL, and at least one end portion of the signal connection line CWL may be provided with a pad WPD_CW in a first non-display area NDA and/or a second non-display area NDA to be connected to the external device EXD.

The data line DTL and the reference voltage line RVL may extend in a second direction DR2 intersecting the first direction DR1. The first power line ELVDL may include a portion extending in the second direction DR2. The first power line ELVDL may further include a portion extending in the first direction DR1. The first power line ELVDL may have a mesh structure, but the present disclosure is not limited thereto.

Line pads WPD may be located on at least one end portion of the data line DTL, the reference voltage line RVL, and the first power line ELVDL. Each of the line pads WPD may be located in a pad portion PDA included in the non-display area NDA. In some embodiments, a line pad WPD_DT of the data line DTL, a line pad WPD_RV of the reference voltage line RVL, and a line pad WPD_ELVD of the first power line ELVDL may be located in the pad portion PDA of the non-display area NDA. As another example, the data pad WPD_DT, the reference voltage pad WPD_RV, and the first power pad WPD_ELVD may be located in another portion of the non-display area NDA. As described above, the external device EXD may be mounted on the line pad WPD. The external device EXD may be mounted on the line pad WPD through an anisotropic conductive film, ultrasonic bonding, or the like.

As shown in FIG. 22, a display panel 100_6 according to some embodiments may include a semiconductor circuit substrate 110, a conductive circuit layer 130_1, a light-emitting element layer 120_6, and a wavelength conversion portion 200. The conductive circuit layer 130_1 may include first to third transistors T1 to T3, an insulating layer IL, and pixel electrodes 111_1a, 111_1b, and 111_1c, the light-emitting element layer 120_6 may include a light-emitting element LE_1, an optical member RP, and a common electrode CE, and the wavelength conversion portion 200 may include a partition wall PW, a wavelength conversion layer QDL, a light blocking member BK, color filters CF1, CF2, and CF3, and a protective layer PTL.

Switching elements T1, T2, and T3 may be located on the semiconductor circuit substrate 110. In some embodiments, a first switching element T1 may be located in a first light-emitting area EA1 of the semiconductor circuit substrate 110, a second switching element T2 may be located in a second light-emitting area EA2 of the semiconductor circuit substrate 110, and a third switching element T3 may be located in a third light-emitting area EA3 of the semiconductor circuit substrate 110. However, the present disclosure is not limited thereto, and in other embodiments, at least one of the first switching element T1, the second switching element T2, the third switching element T3 may be located in the non-light-emitting area.

In the present embodiments, each of the first switching element T1, the second switching element T2, and the third switching element T3 may be a thin-film transistor including amorphous silicon, polysilicon, or an oxide semiconductor. In addition, in some embodiments, a plurality of signal lines (e.g., a gate line, a data line, a power line, and the like) transmitting signals to each switching element may be further located on the semiconductor circuit substrate 110.

The insulating layer IL may be located on the first switching element T1, the second switching element T2, and the third switching element T3. The insulating layer IL may be a planarization layer, and may include an organic material. For example, the insulating layer IL may include an acrylic-based resin, an epoxy-based resin, an imide-based resin, an ester-based resin, or the like. In some embodiments, the insulating layer IL may include a positive photosensitive material or a negative photosensitive material.

The plurality of pixel electrodes 111_1a, 111_1b, and 111_1c may be located on the insulating layer IL.

A first pixel electrode 111_1a, a second pixel electrode 111_1b, and a third pixel electrode 111_1c may each serve as a first electrode of the light-emitting element LE_1, and may be an anode or a cathode. The first pixel electrode 111_1a is located in the first light-emitting area EA1, and at least a portion of the first pixel electrode 111_1a may extend to an area between the non-light-emitting areas EA1, EA2, and EA3. The second pixel electrode 111_1b is located in the second light-emitting area EA2, and at least a portion of the second pixel electrode 111_1b may extend to the non-light-emitting area. The third pixel electrode 111_1c is located in the third light-emitting area EA3, and at least a portion of the third pixel electrode 111_1c may extend to the non-light-emitting area.

The first pixel electrode 111_1a may be connected to the first switching element T1 through the insulating layer IL, the second pixel electrode 111_1b may be connected to the second switching element T2 through the insulating layer IL, and the third pixel electrode 111_1c may be connected to the third switching element T3 through the insulating layer IL.

The first pixel electrode 111_1a, the second pixel electrode 111_1b, and the third pixel electrode 111_1c may be reflective electrodes. Each of the first pixel electrode 111_1a, the second pixel electrode 111_1b, and the third pixel electrode 111_1c may have a stacked film structure formed by stacking a material layer having a high work function and a reflective material layer, wherein the material layer having a high work function is made of one selected from among titanium oxide ($TiO_2$), indium tin oxide (ITO), indium zinc oxide (IZO), zinc oxide (ZnO), indium tin zinc oxide (ITZO), and magnesium oxide (MgO), and the reflective material layer is made of one selected from among silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and a mixture thereof. The material layer having a high work function may be located above the reflective material layer to be close to the light-emitting element LE_1. Each of the first pixel electrode 111_1a, the second pixel electrode 111_1b, and the third pixel electrode 111_1c may have a multi-layered structure of ITO/Mg, ITO/MgF, ITO/Ag, or ITO/Ag/ITO, but the present disclosure is not limited thereto.

An optical pattern LRP may be located on the first pixel electrode 111_1a, the second pixel electrode 111_1b, and the third pixel electrode 111_1c. The optical pattern LRP may include an opening configured to expose the first pixel electrode 111_1a, an opening configured to expose the second pixel electrode 111_1b, and an opening configured to expose the third pixel electrode 111_1c, and may define the first light-emitting area EA1, the second light-emitting area EA2, the third light-emitting area EA3, and the non-light-emitting area.

A plurality of light-emitting elements LE_1 may be located on the first pixel electrode 111_1a, the second pixel electrode 111_1b, and the third pixel electrode 111_1c. As shown in FIG. 23, the plurality of light-emitting elements LE_1 may be located on each of the pixel electrodes 111_1a, 111_1b, and 111_1c. That is, the plurality of light-emitting elements LE_1 may be located on one pixel electrode.

The light-emitting element LE_1 may be located in each of the first light-emitting area EA1, the second light-emitting area EA2, and the third light-emitting area EA3. The light-emitting element LE_1 may be a vertical LED element extending in a third direction DR3. The light-emitting element LE_1 may further include a third semiconductor layer SEM3 (see FIG. 24) located on the second semiconductor layer SEM2. The third semiconductor layer SEM3 may be located between the second semiconductor layer SEM2 and the common electrode CE. The third semiconductor layer SEM3 may be an undoped semiconductor. The third semiconductor layer SEM3 may include the same material as the second semiconductor layer SEM2, but may include a material into which an n-type or p-type dopant is not doped. In some embodiments, the third semiconductor layer SEM3 may include at least one selected from among undoped InAlGaN, GaN, AlGaN, InGaN, AlN, and InN, but the present disclosure is not limited thereto.

The light-emitting element LE_1 may have a cylindrical shape, a disk shape, or a rod shape having a width greater than a height. However, the present disclosure is not limited thereto, and the light-emitting element LE_1 may have various forms such as a shape of a rod, a wire, a tube, or the like, a shape of a polygonal column such as a regular hexahedron, rectangular parallelepiped, and a hexagonal column, or a shape that extends in one direction but has a partially inclined outer surface.

A connection electrode 125 may be located on an upper portion of each of the plurality of pixel electrodes 111_1a, 111_1b, and 111_1c. Hereinafter, the light-emitting element LE_1 located on the first pixel electrode 111_1a will be described as an example.

The connection electrode 125 may be bonded to the first pixel electrode 111_1a, and may serve to apply an emission signal to the light-emitting element LE_1. The connection electrode 125 may be an ohmic connection electrode. However, the present disclosure is not limited thereto, and the connection electrode 125 may also be a Schottky connection electrode. The light-emitting element LE_1 may include at least one connection electrode 125.

As shown in FIG. 25, in some embodiments, the first pixel electrode 111_1a may include a lower electrode layer P1, a reflective layer P2, and an upper electrode layer P3. The lower electrode layer P1 may be located at a lowermost portion of the first pixel electrode 111_1a and electrically connected to the switching element. The lower electrode layer P1 may include a metal oxide, for example, titanium oxide ($TiO_2$), indium tin oxide (ITO), indium zinc oxide (IZO), zinc oxide (ZnO), indium tin zinc oxide (ITZO), or magnesium oxide (MgO).

The reflective layer P2 may be located on the lower electrode layer P1 to reflect light, which is emitted from the light-emitting element LE_1, upward. The reflective layer P2 may include a metal having a high reflectivity, for example, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof.

The upper electrode layer P3 may be located on the reflective layer P2 and may be in direct contact with the light-emitting element LE_1. The upper electrode layer P3 may be located between the connection electrode 125 of the light-emitting element LE_1 and the reflective layer P2, and may be in direct contact with the connection electrode 125. As described above, the connection electrode 125 is made of a metal oxide, and the upper electrode layer P3 may also be made of a metal oxide like the connection electrode 125. The upper electrode layer P3 may include titanium oxide ($TiO_2$), indium tin oxide (ITO), indium zinc oxide (IZO), zinc oxide (ZnO), indium tin zinc oxide (ITZO), or magnesium oxide (MgO). In some embodiments, when the connection electrode 125 is made of ITO, the first pixel electrode 111_1a may be formed in a multi-layered structure of ITO/Ag/ITO.

As shown in FIG. 26, an optical layer HRP may be located on the optical pattern LRP and the pixel electrodes 111_1*a*, 111_1*b*, and 111_1*c*. The optical layer HRP may overlap the optical pattern LRP. The optical layer HRP may expose an upper surface of the light-emitting element LE_1 (or an upper surface of the third semiconductor layer SEM3), and an upper end portion of a side surface of the light-emitting element LE_1.

The optical layer HRP may planarize a stepped portion therebelow so that the common electrode CE to be described below is formed. The optical layer HRP may be formed at a height (e.g., a predetermined height) so that the upper portion of each of the plurality of light-emitting elements LE_1 may protrude from an upper portion of the optical layer HRP. That is, a height of the optical layer HRP may be less than a height of the light-emitting element LE_1 with respect to an upper surface of the first pixel electrode 111_1*a*.

The common electrode CE may be located on the optical layer HRP and the plurality of light-emitting elements LE_1. For example, the common electrode CE may be located on one surface of the semiconductor circuit substrate 110 on which the light-emitting element LE_1 is formed, and may be located on the entirety of the display area DA and the non-display area NDA. The common electrode CE may overlap the light-emitting areas EA1, EA2, and EA3 in the display area DA, and may be formed to have a relatively thin thickness so that light may be emitted.

The common electrode CE may be located directly on the upper and side surfaces of the plurality of light-emitting elements LE_1. The common electrode CE may be in direct contact with the second semiconductor layer SEM2 and the third semiconductor layer SEM3 among the side surfaces of the light-emitting element LE_1. Due to the structure in which the second semiconductor layer SEM2 having conductivity is patterned on each of the light-emitting elements LE_1, the common electrode CE may be in direct contact with the side surfaces of the second semiconductor layer SEM2 of each of the light-emitting elements LE_1 so that the common voltage may be applied to each of the light-emitting elements LE_1.

According to the present embodiments, like the display panel 100 shown in FIG. 5, light that is emitted from the light-emitting element LE_1 and passes through the optical layer HRP may be totally reflected at an interface between the optical layer HRP and the optical pattern LRP. Thus, light emission efficiency may be improved by inducing light to be condensed at a center portion of each of the light-emitting areas EA1, EA2, and EA3.

According to a display device according to embodiments, light efficiency can be improved.

Aspects according to the embodiments are not limited by the content described above, and more various aspects are included in the present specification.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, with functional equivalents thereof to be included therein.

What is claimed is:

1. A display device comprising:
a substrate;
a partition wall on the substrate;
a light-emitting element on the substrate in a light-emitting area partitioned by the partition wall, and extending in a thickness direction of the substrate such that a length of the light-emitting element in the thickness direction is greater than a width of the light-emitting element in a direction perpendicular to the thickness direction;
a light conversion layer on the light-emitting element in the light-emitting area, and configured to convert a wavelength of light emitted from the light-emitting element or to transmit the light; and
an optical member comprising an optical pattern on the partition wall, and an optical layer on the light conversion layer, wherein a refractive index of the optical layer and a refractive index of the optical pattern are different from each other.

2. The display device of claim 1, wherein the refractive index of the optical layer is greater than the refractive index of the optical pattern.

3. The display device of claim 2, wherein the optical layer is on the partition wall.

4. The display device of claim 3, wherein the optical layer overlaps the optical pattern.

5. The display device of claim 4, wherein the optical pattern completely overlaps the optical layer.

6. The display device of claim 4, further comprising a color filter on the optical member.

7. The display device of claim 4, further comprising a capping layer between the light conversion layer and the optical layer, and comprising an inorganic material.

8. The display device of claim 7, wherein the capping layer is between the light conversion layer and the optical layer, and between the partition wall and the optical pattern.

9. The display device of claim 2, wherein the optical pattern has a line shape extending in one direction.

10. The display device of claim 1, further comprising a light scattering layer between the light conversion layer and the light-emitting element in the light-emitting area, and comprising scattering particles.

11. The display device of claim 10, wherein the light scattering layer and the light conversion layer are in direct contact with each other.

12. A display device comprising:
a substrate;
a first light-emitting area configured to emit first light, a second light-emitting area configured to emit second light, and a third light-emitting area configured to emit third light, in a display area of the substrate;
a partition wall configured to partition the first light-emitting area, the second light-emitting area, and the third light-emitting area;
a light-emitting element in each of the first light-emitting area, the second light-emitting area, and the third light-emitting area to be spaced apart from the partition wall, and extending in a thickness direction of the substrate such that a length of the light-emitting element in the thickness direction is greater than a width of the light-emitting element in a direction perpendicular to the thickness direction;
a light conversion layer on one of the light-emitting elements, and configured to convert a wavelength of light emitted from the one of the light-emitting elements or to transmit the light; and
an optical member comprising an optical pattern on the partition wall, and an optical layer on the light conversion layer, wherein a refractive index of the optical layer is greater than a refractive index of the optical pattern.

13. The display device of claim 12, wherein the light conversion layer comprises:

a light transmission layer in the first light-emitting area, and configured to transmit the light;

a first wavelength conversion layer in the second light-emitting area, and configured to convert a portion of the first light into the second light; and a second wavelength conversion layer in the third light-emitting area, and configured to convert a portion of the first light into the third light.

14. The display device of claim 12, further comprising a light scattering layer between the light conversion layer and the light-emitting element in a respective one of the first light-emitting area, the second light-emitting area, or the third light-emitting area, and comprising scattering particles.

15. The display device of claim 14, wherein the light scattering layer and the light conversion layer are in direct contact with each other.

16. A display device comprising:

a substrate;

a pixel electrode on the substrate in a light-emitting area;

light-emitting elements on the pixel electrode, and extending in a thickness direction of the substrate such that a length of the light-emitting element in the thickness direction is greater than a width of the light-emitting element in a direction perpendicular to the thickness direction; and an optical member on the pixel electrode, and comprising an optical pattern configured to expose an upper surface of the pixel electrode, and an optical layer on the optical pattern, a refractive index of the optical layer being greater than a refractive index of the optical pattern.

17. The display device of claim 16, wherein the optical pattern partially overlaps the pixel electrode.

18. The display device of claim 17, wherein the optical layer overlaps the optical pattern.

19. The display device of claim 18, wherein the optical layer exposes an upper surface of the light-emitting elements and an upper end portion of a side surface of the light-emitting elements.

20. The display device of claim 19, further comprising a common electrode on the optical layer and the light-emitting elements, and in direct contact with the upper surface of the light-emitting elements and the upper end portion of the side surface of the light-emitting elements.

* * * * *